United States Patent
Kim et al.

(10) Patent No.: US 10,260,734 B2
(45) Date of Patent: Apr. 16, 2019

(54) LIGHT SOURCE UNIT

(71) Applicant: LG INNOTEK CO., LTD., Seoul (KR)

(72) Inventors: Do Hwan Kim, Seoul (KR); Jae Jin Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/544,456

(22) PCT Filed: Jan. 27, 2016

(86) PCT No.: PCT/KR2016/000897
§ 371 (c)(1),
(2) Date: Jul. 18, 2017

(87) PCT Pub. No.: WO2016/122216
PCT Pub. Date: Aug. 4, 2016

(65) Prior Publication Data
US 2018/0010784 A1 Jan. 11, 2018

(30) Foreign Application Priority Data
Jan. 28, 2015 (KR) .................. 10-2015-0013359

(51) Int. Cl.
*F21V 31/00* (2006.01)
*F21V 29/70* (2015.01)
(Continued)

(52) U.S. Cl.
CPC .......... *F21V 31/005* (2013.01); *F21V 19/005* (2013.01); *F21V 29/70* (2015.01);
(Continued)

(58) Field of Classification Search
CPC ...... F21V 31/005; F21V 29/70; F21V 19/005; H01L 33/486; H01L 33/62; F21Y 2115/10
See application file for complete search history.

(56) References Cited

U.S. PATENT DOCUMENTS 8,405,096 B2 * 3/2013 Chen ................. H01L 33/60
257/79
9,765,937 B2 * 9/2017 Cha .................... F21K 9/64
(Continued)

FOREIGN PATENT DOCUMENTS

JP 2014-175270 A 9/2014
KR 10-2009-0077100 A 7/2009
(Continued)

OTHER PUBLICATIONS

International Search Report, issued in PCT/KR2016/000897, dated May 20, 2018.

*Primary Examiner* — David E Smith
(74) *Attorney, Agent, or Firm* — Birch, Stewart, Kolasch & Birch, LLP

(57) ABSTRACT

A light source unit disclosed in an embodiment includes a first cover which has an open region; a second cover which is coupled to the first cover; a light source module which is disposed between the first cover and the second cover, and has a light-emitting device disposed on the open region and a circuit board on which the light-emitting device is disposed; a fixing frame which is disposed between the second cover and the circuit board; and a resin member which is filled in an region between the first cover and the second cover and supports the light source module and the fixing frame. The light source module includes a moisture-proof film which covers an upper surface and side surfaces of the light-emitting device and extends to an upper surface of the circuit board.

20 Claims, 19 Drawing Sheets

(51) Int. Cl.
  *F21V 19/00* (2006.01)
  *H01L 33/48* (2010.01)
  *H01L 33/62* (2010.01)
  *F21Y 115/10* (2016.01)
  *H01L 33/52* (2010.01)

(52) U.S. Cl.
  CPC ............ *H01L 33/48* (2013.01); *H01L 33/486* (2013.01); *H01L 33/62* (2013.01); *F21Y 2115/10* (2016.08); *H01L 33/52* (2013.01)

(56) References Cited

U.S. PATENT DOCUMENTS

| | | | |
|---|---|---|---|
| 2007/0223226 A1* | 9/2007 | Park | H01L 25/0753 362/267 |
| 2010/0135020 A1* | 6/2010 | Moore | A47F 11/10 362/249.02 |
| 2010/0296265 A1 | 11/2010 | Kim et al. | |
| 2012/0020104 A1* | 1/2012 | Biebl | F21K 9/00 362/546 |
| 2012/0074434 A1* | 3/2012 | Park | H01L 33/486 257/88 |
| 2012/0224119 A1* | 9/2012 | Cho | G09F 13/22 349/61 |
| 2016/0059767 A1* | 3/2016 | Kwak | B60Q 1/2638 362/520 |

FOREIGN PATENT DOCUMENTS

| | | | | |
|---|---|---|---|---|
| KR | 10-2010-0131209 A | | 12/2010 | |
| KR | 20100131209 A | * | 12/2010 | ............... F21V 5/04 |
| KR | 10-2014-0095751 A | | 8/2014 | |
| WO | WO 2008/117334 A1 | | 10/2008 | |
| WO | WO 2008117334 A1 | * | 10/2008 | ............. F21V 31/00 |
| WO | WO-2008117334 A1 | * | 10/2008 | ............. F21V 31/00 |

* cited by examiner

[Figure 1]
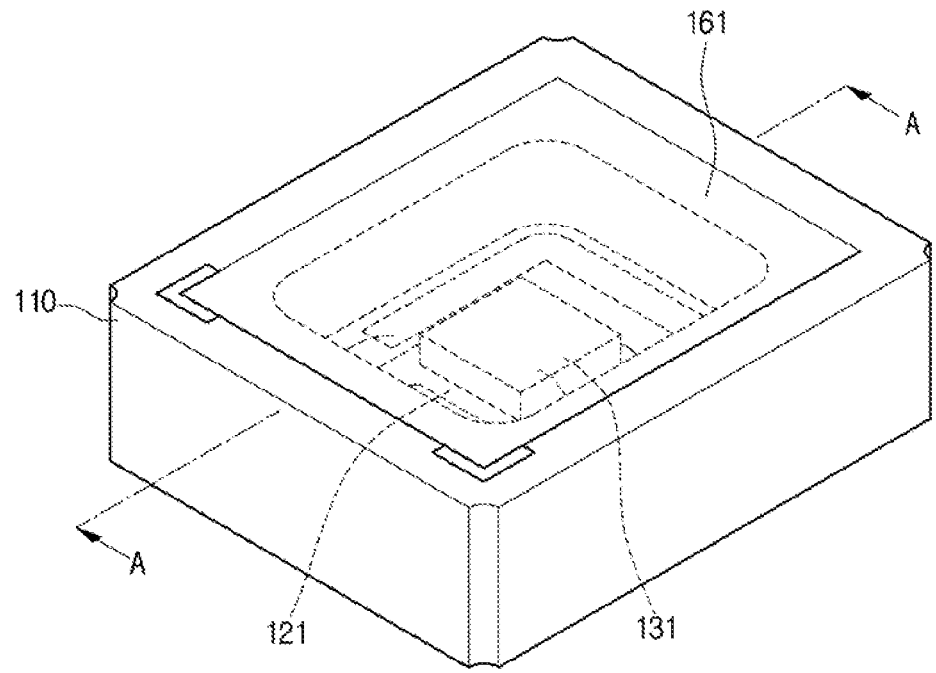
[Figure 2]
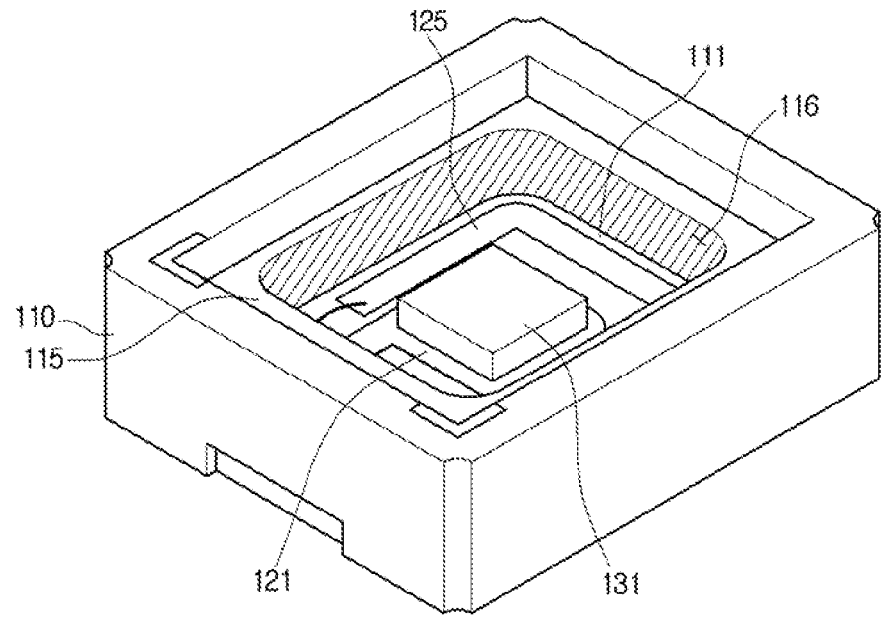

[Figure 3]
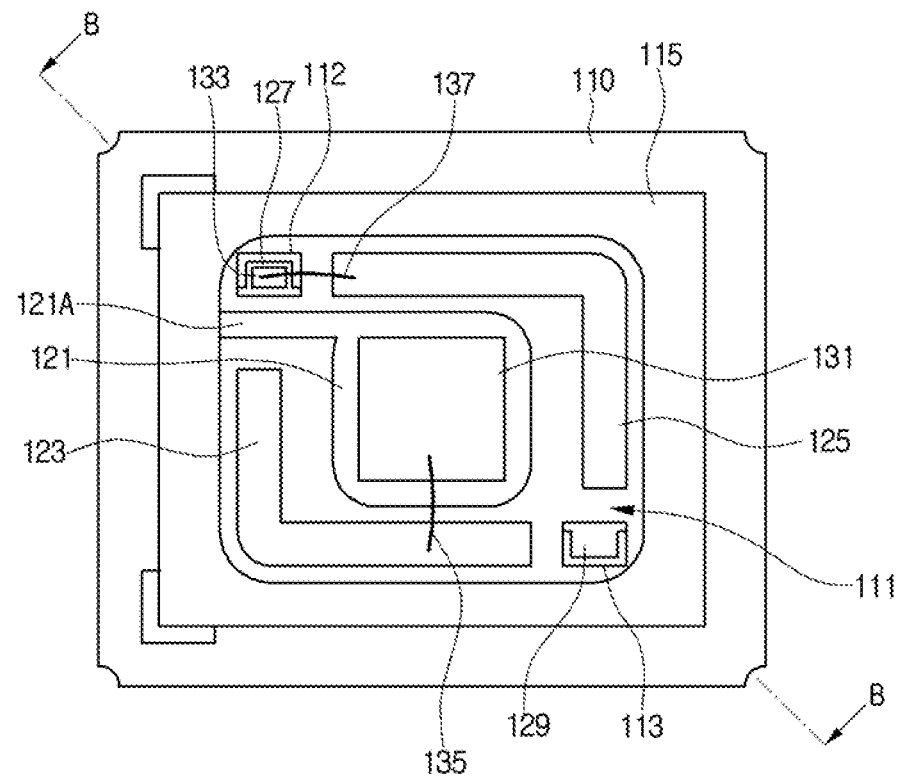
[Figure 4]
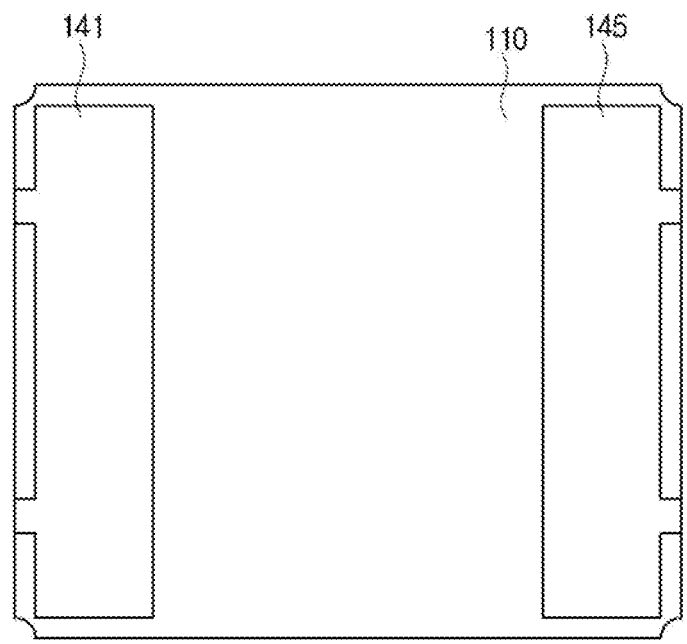

[Figure 5]
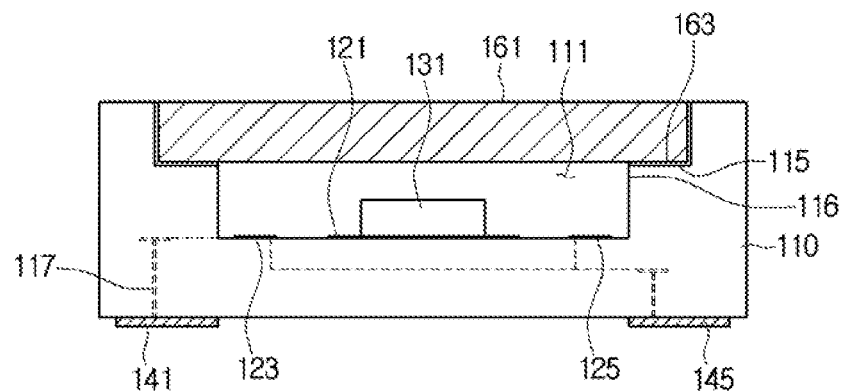
[Figure 6]
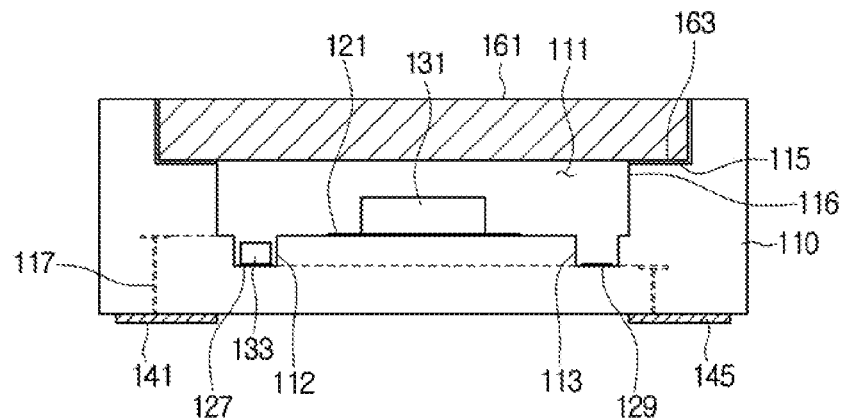
[Figure 7]
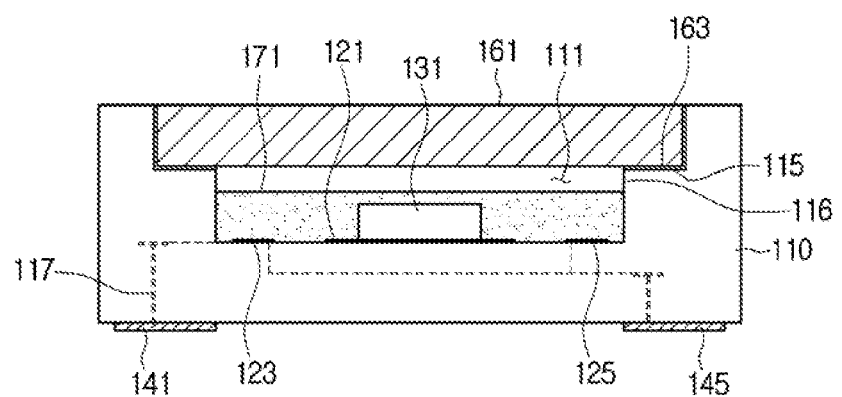

[Figure 8]
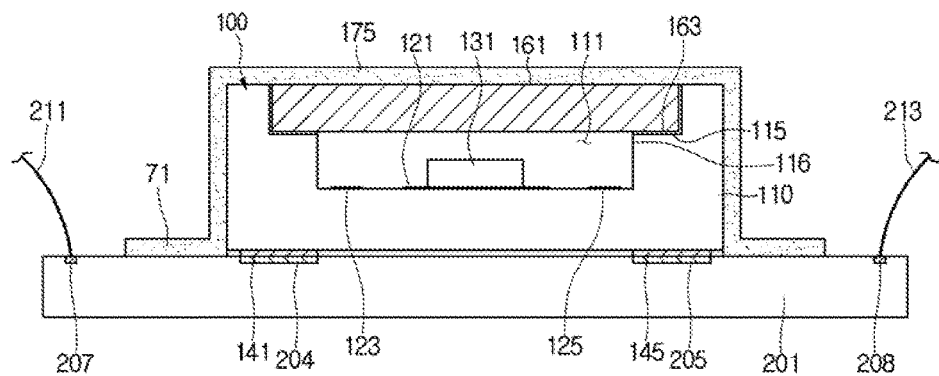
[Figure 9]
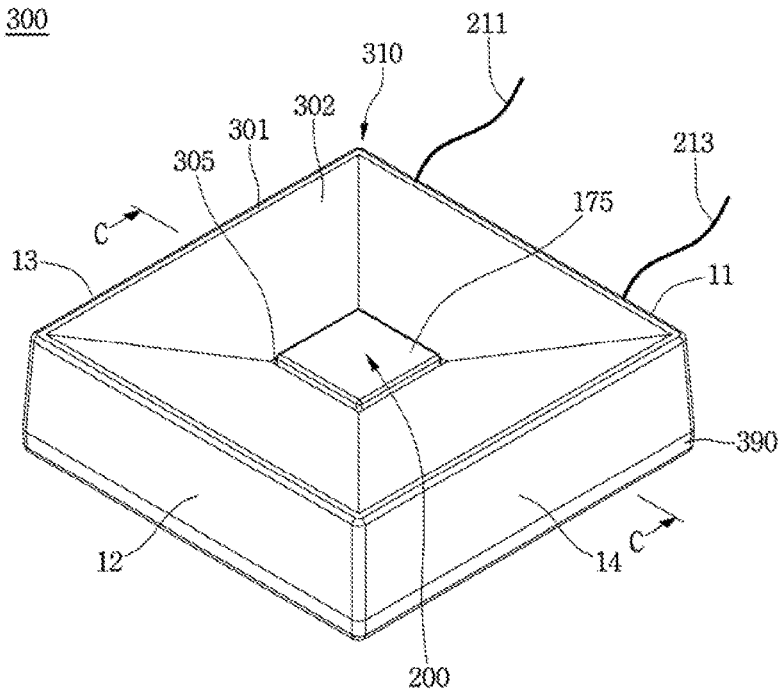

[Figure 10]
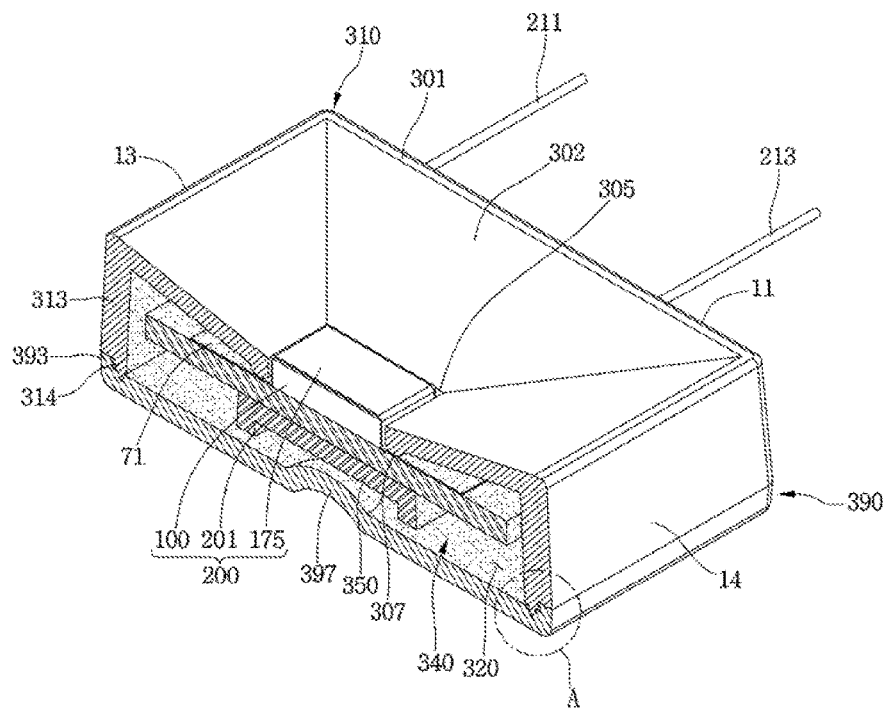
[Figure 11]
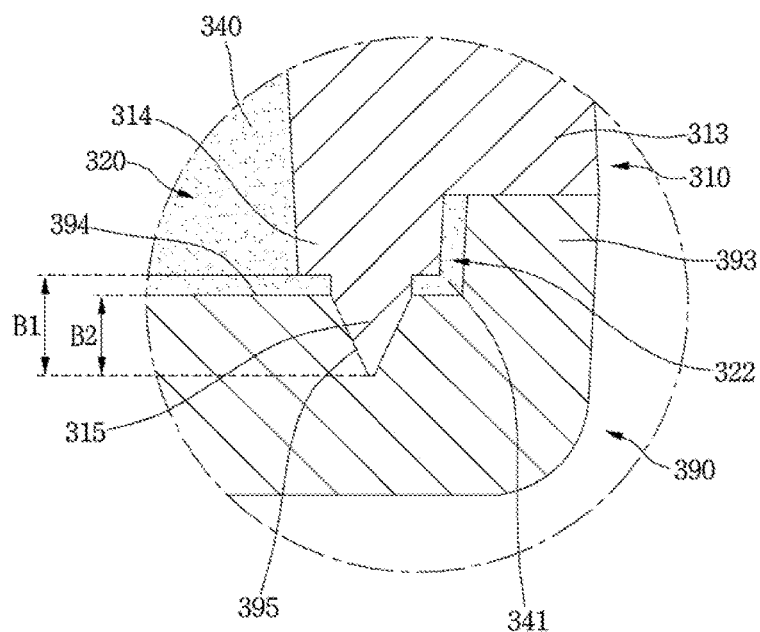

[Figure 12]
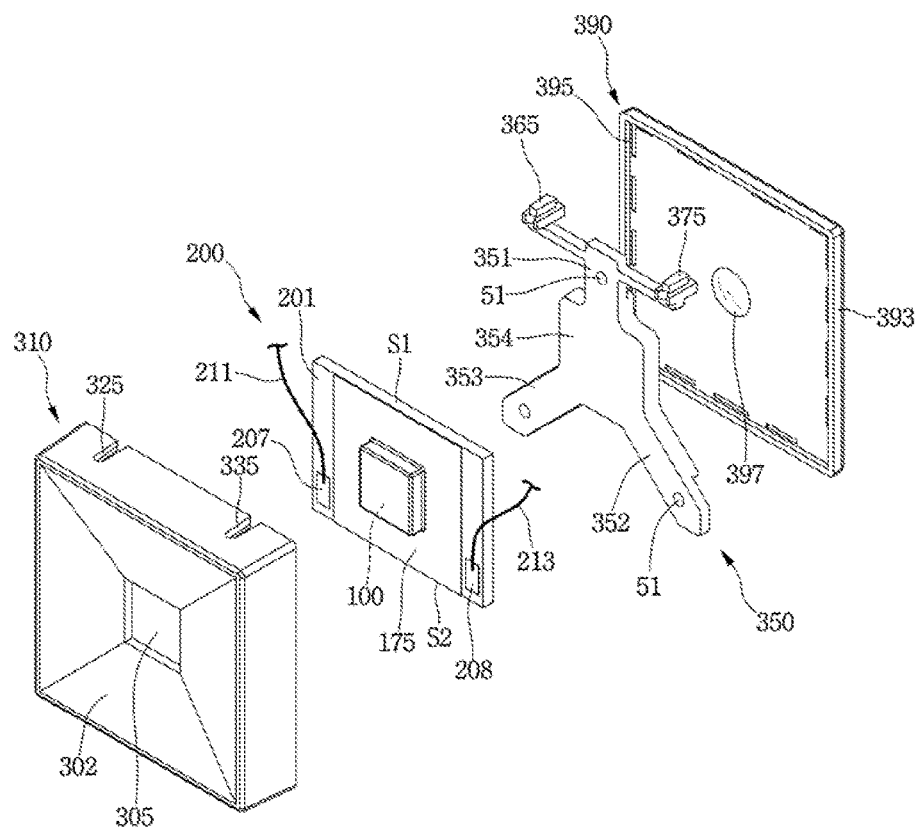

[Figure 13]
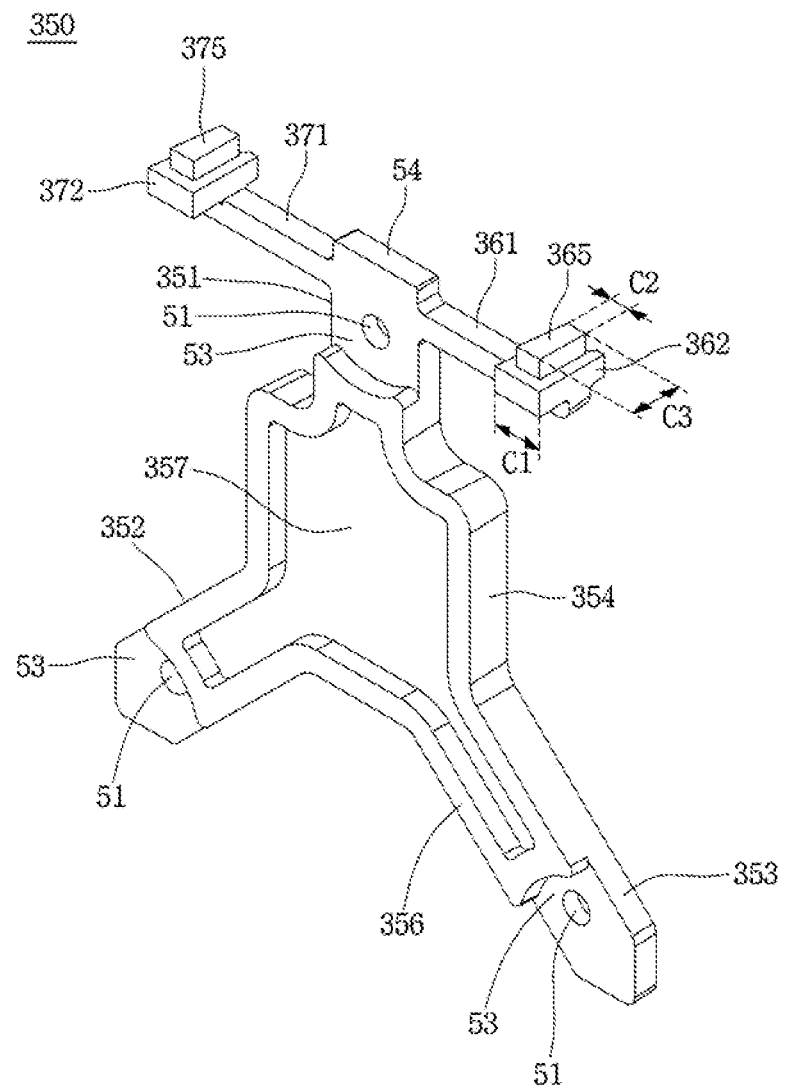

[Figure 14]
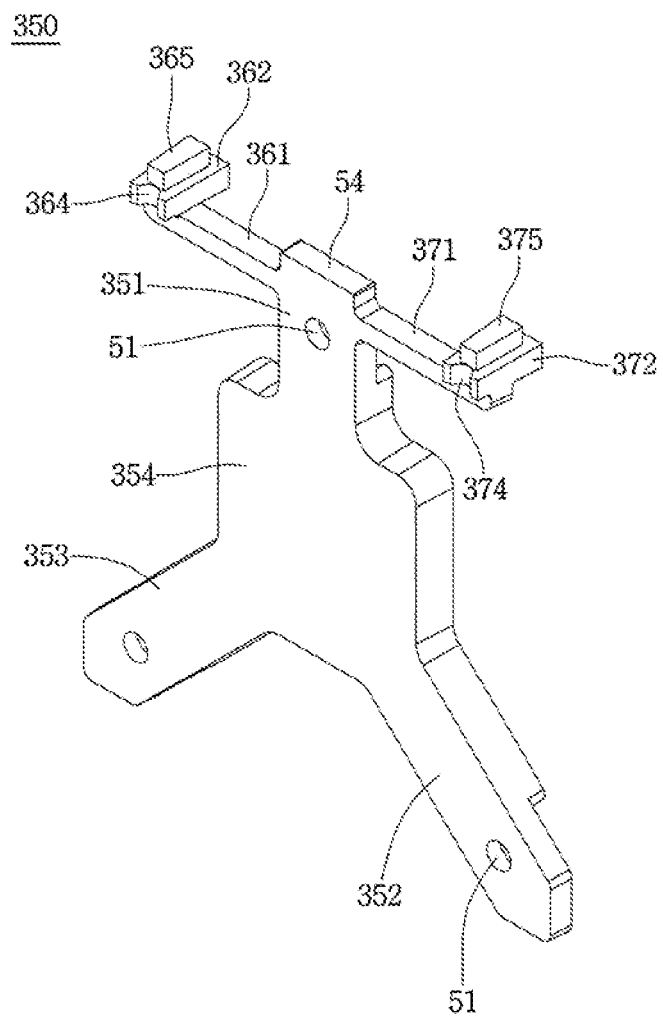

[Figure 15]
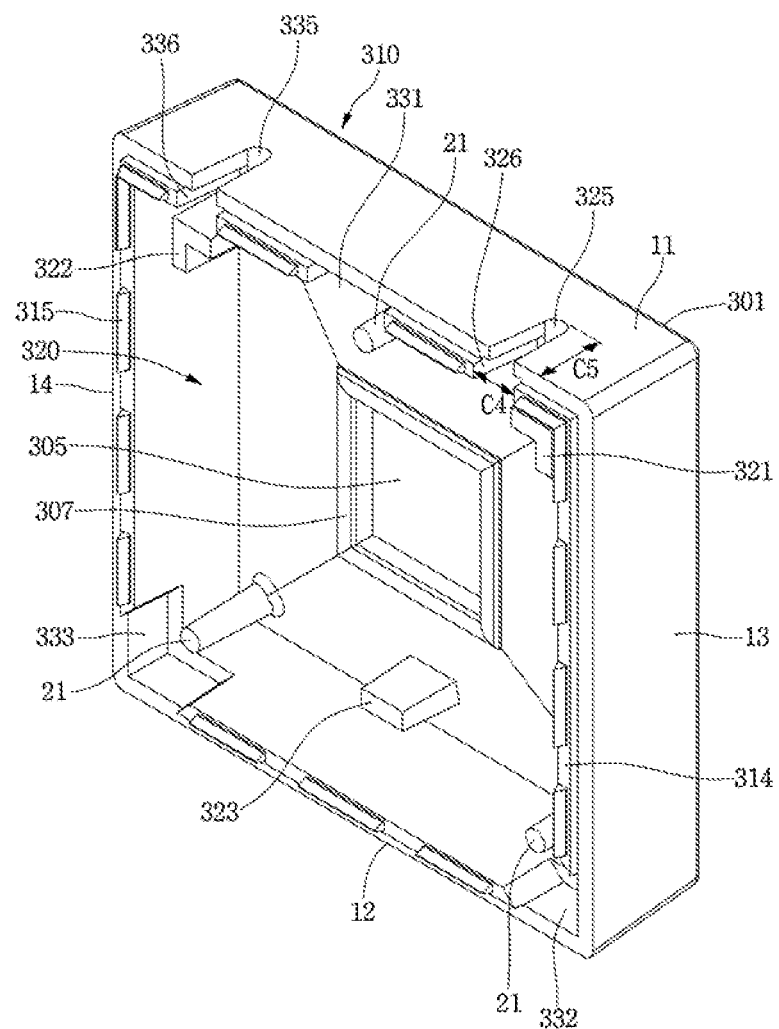

[Figure 16]
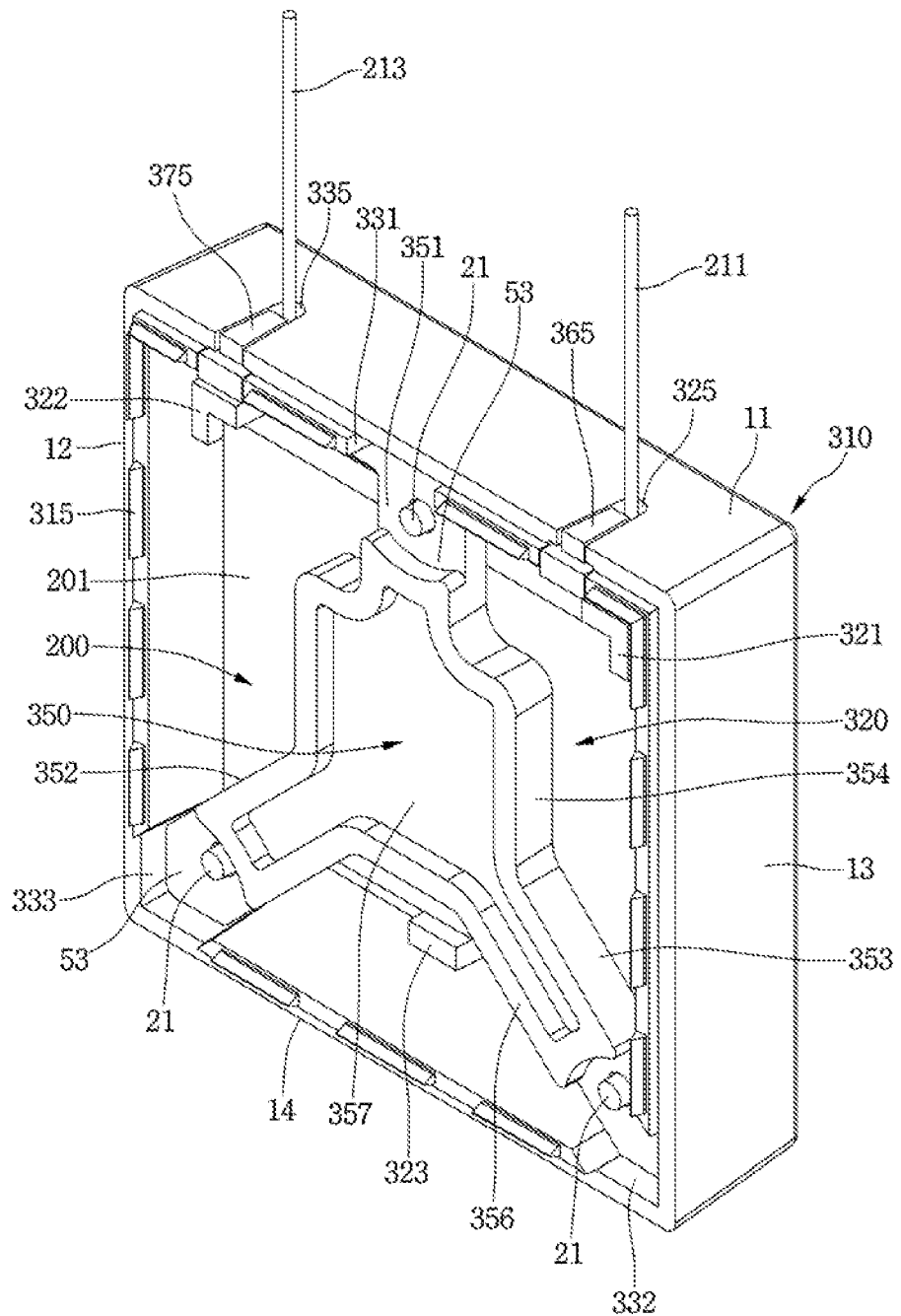

[Figure 17]
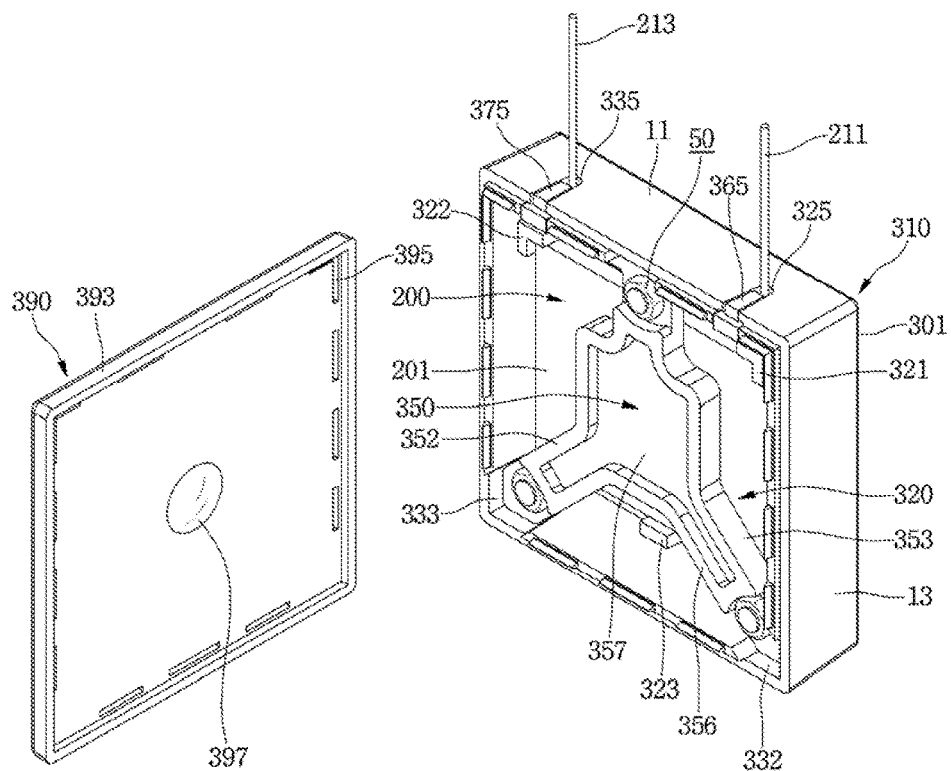

[Figure 18]
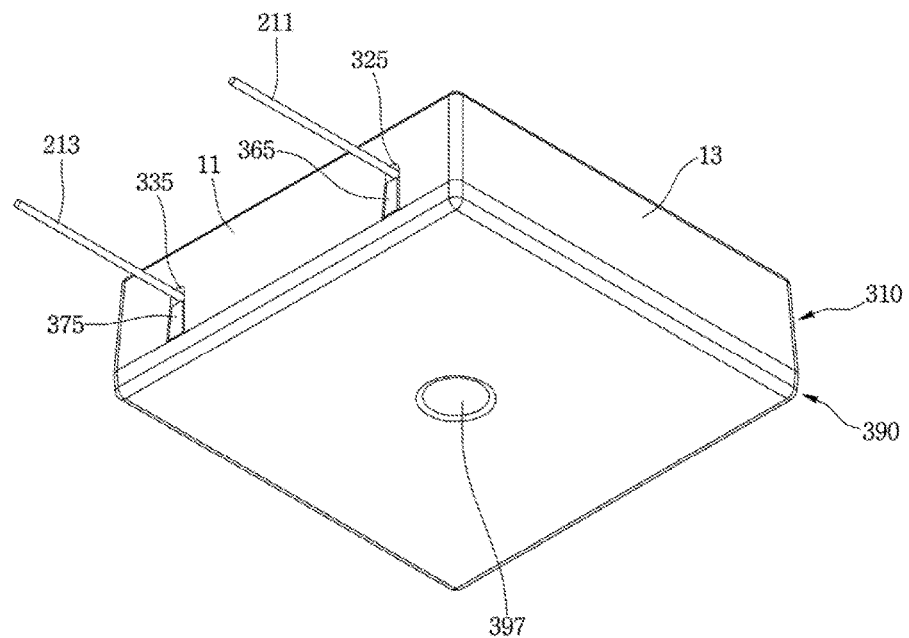
[Figure 19]
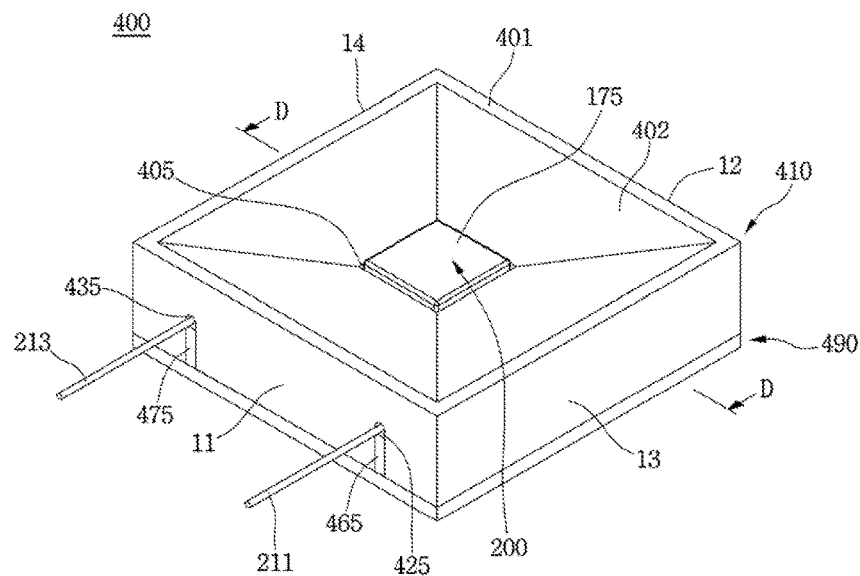

[Figure 20]
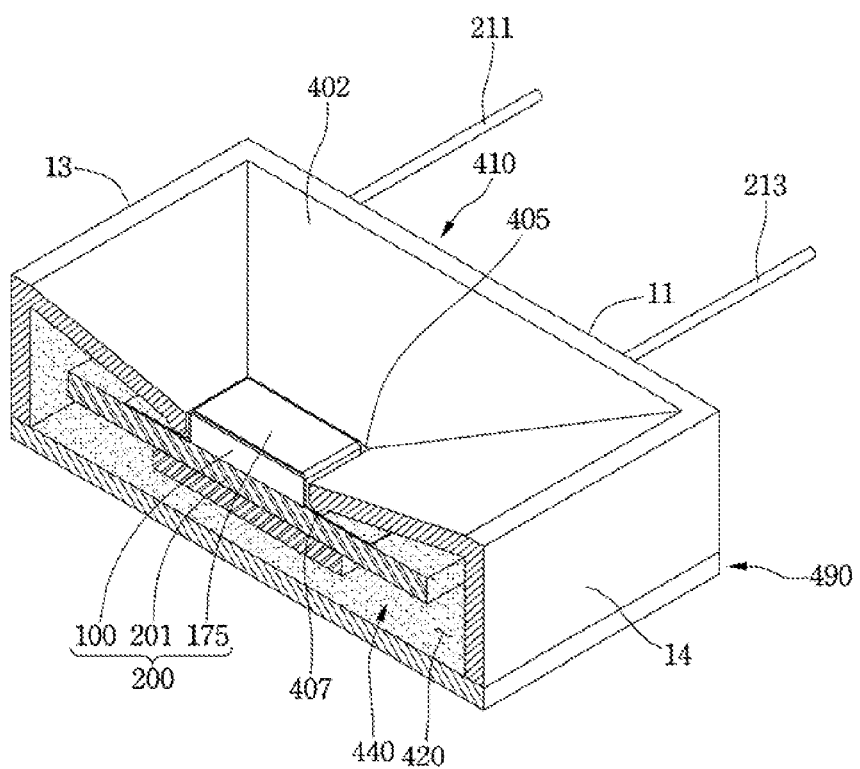

[Figure 21]
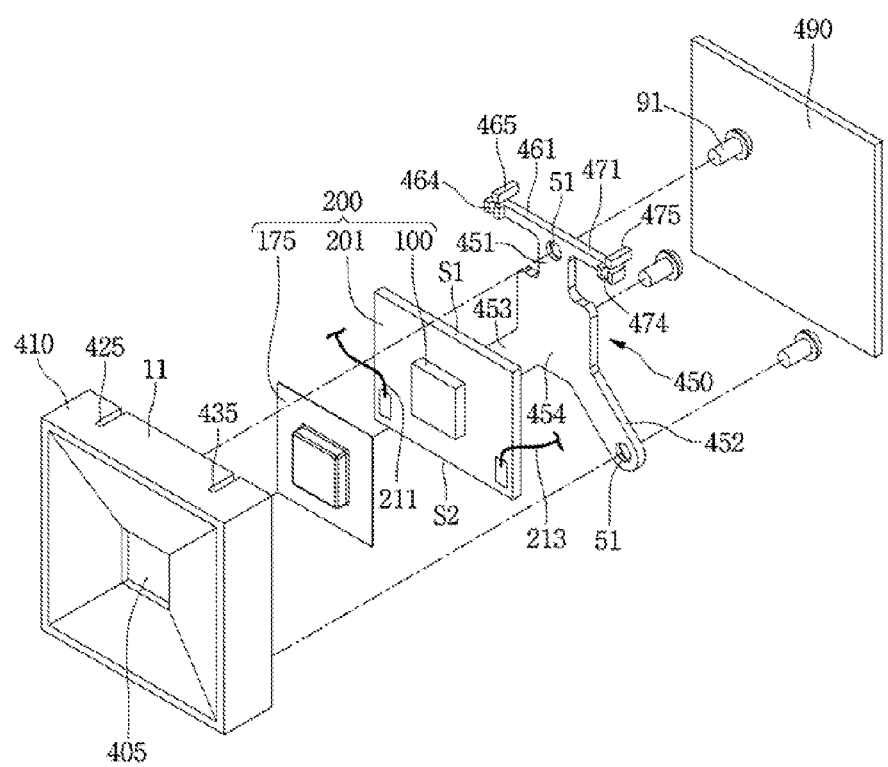

[Figure 22]
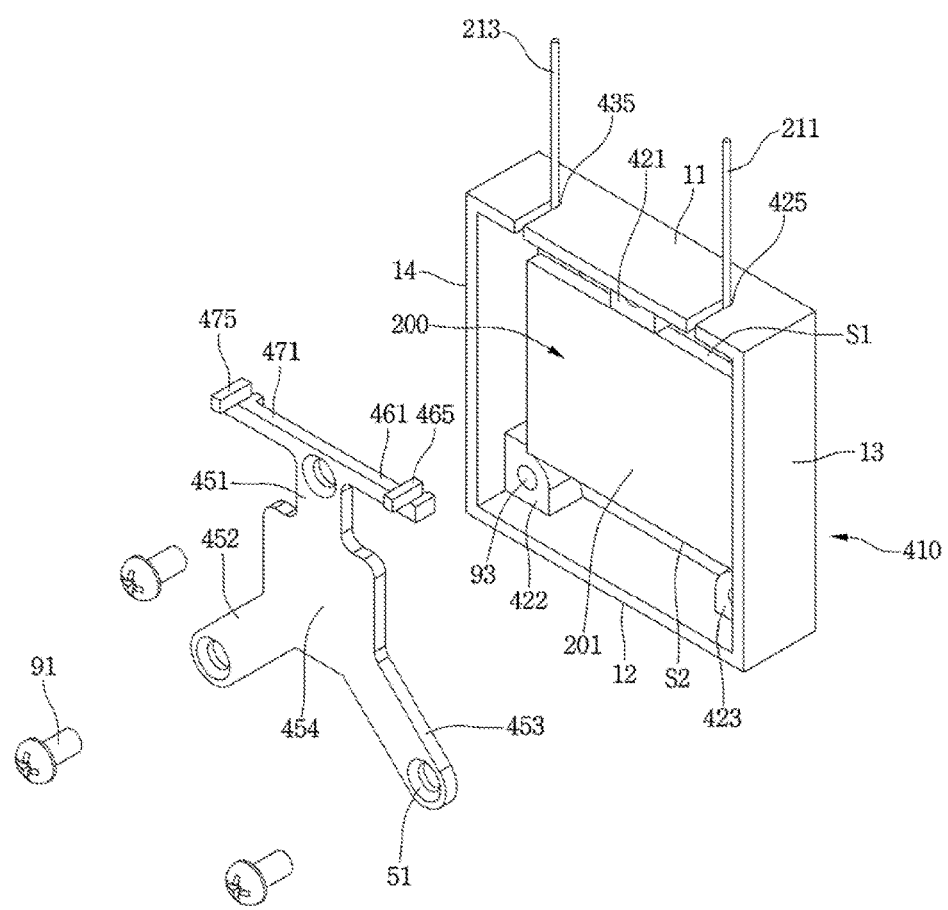

[Figure 23]
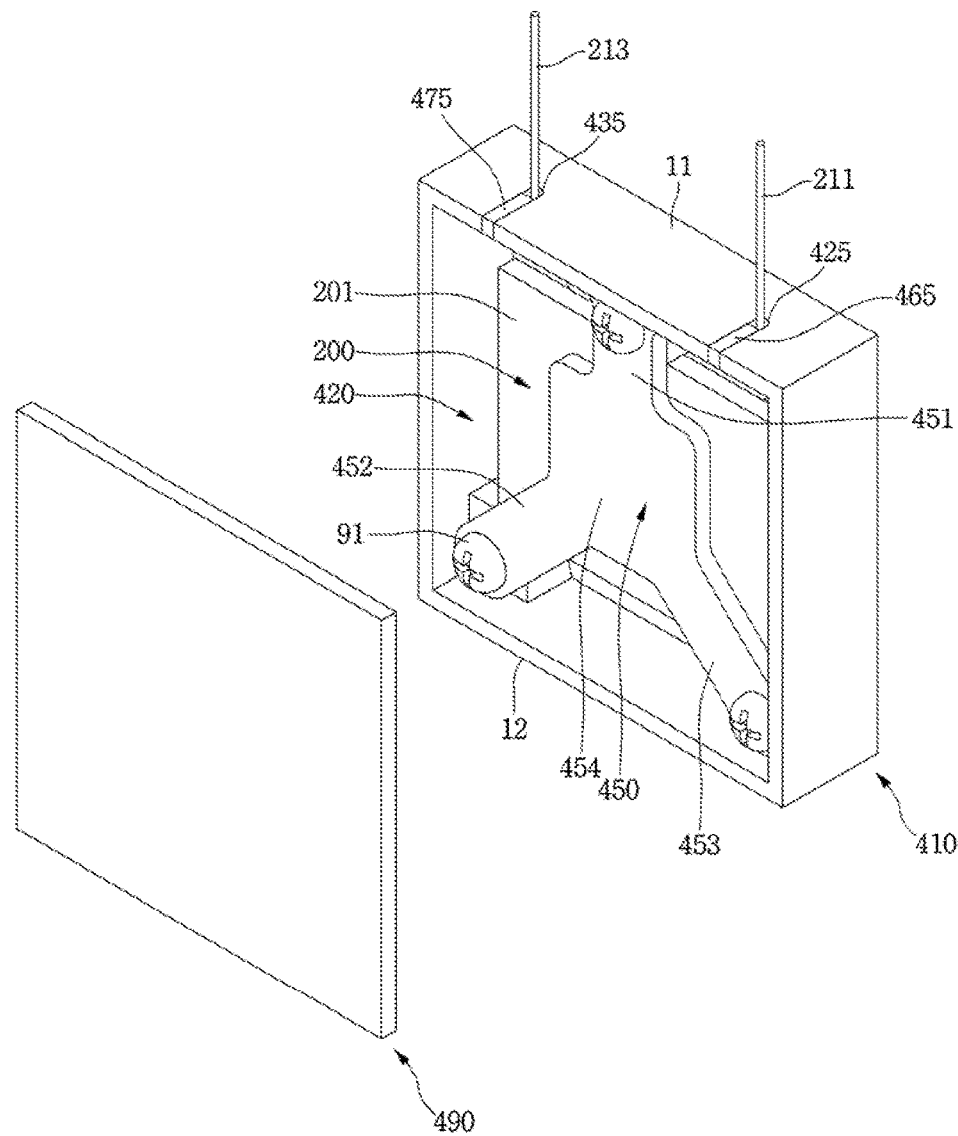

[Figure 24]
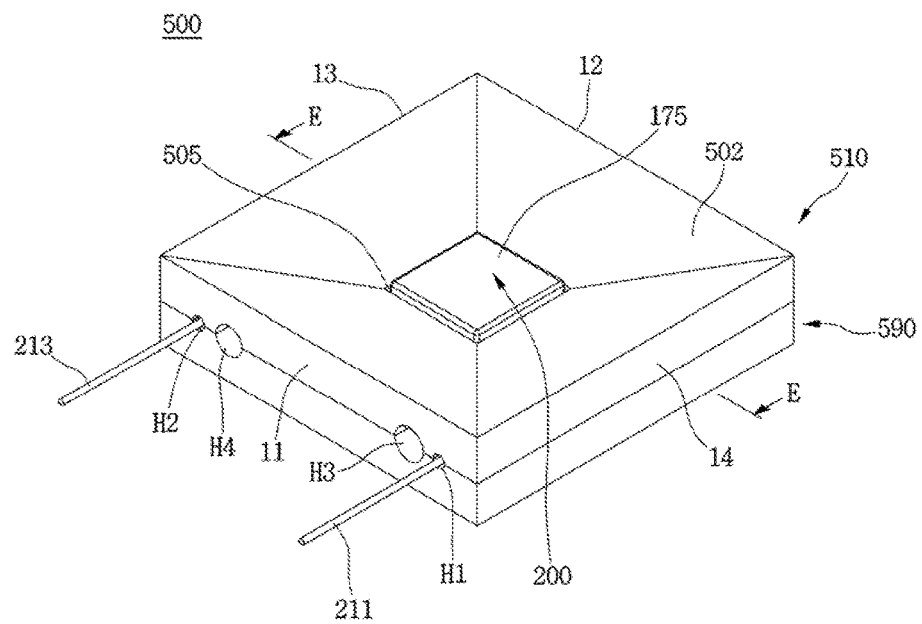
[Figure 25]
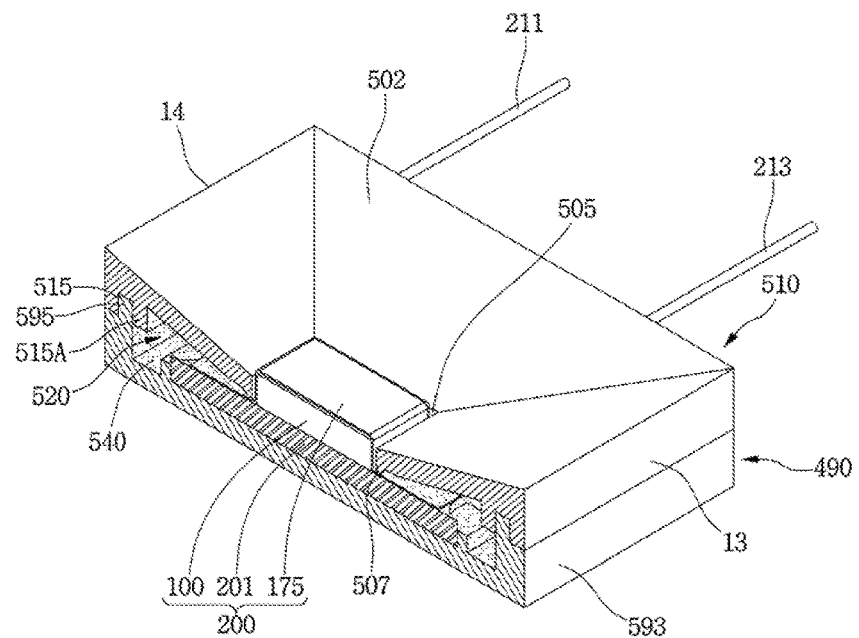

[Figure 26]
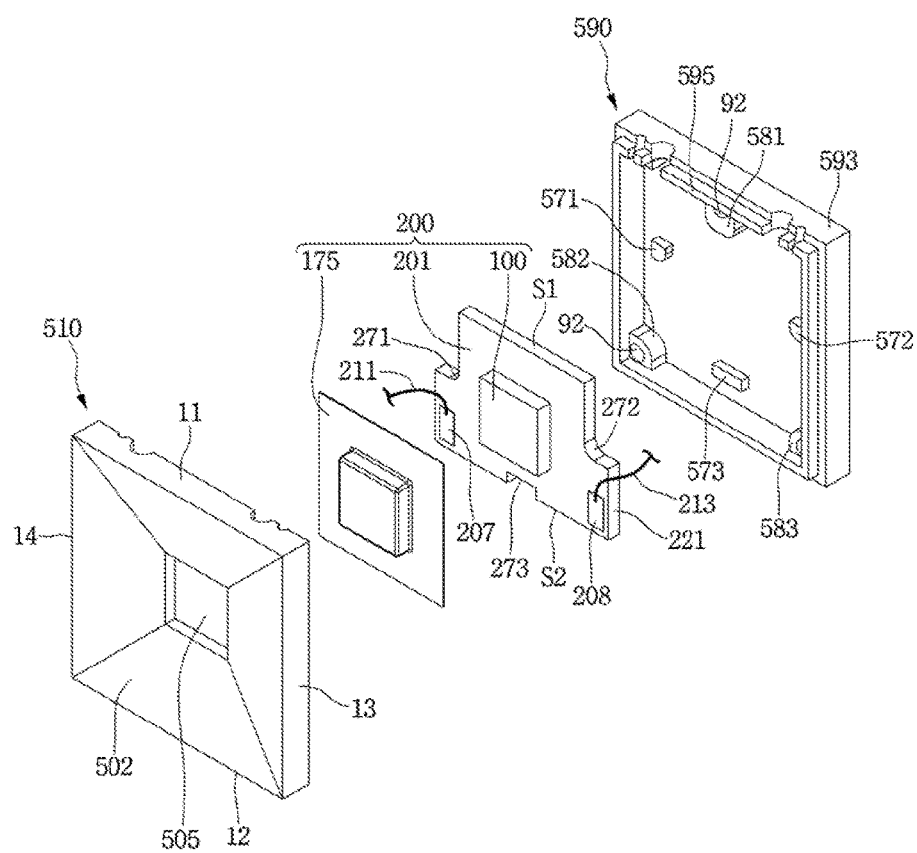

[Figure 27]
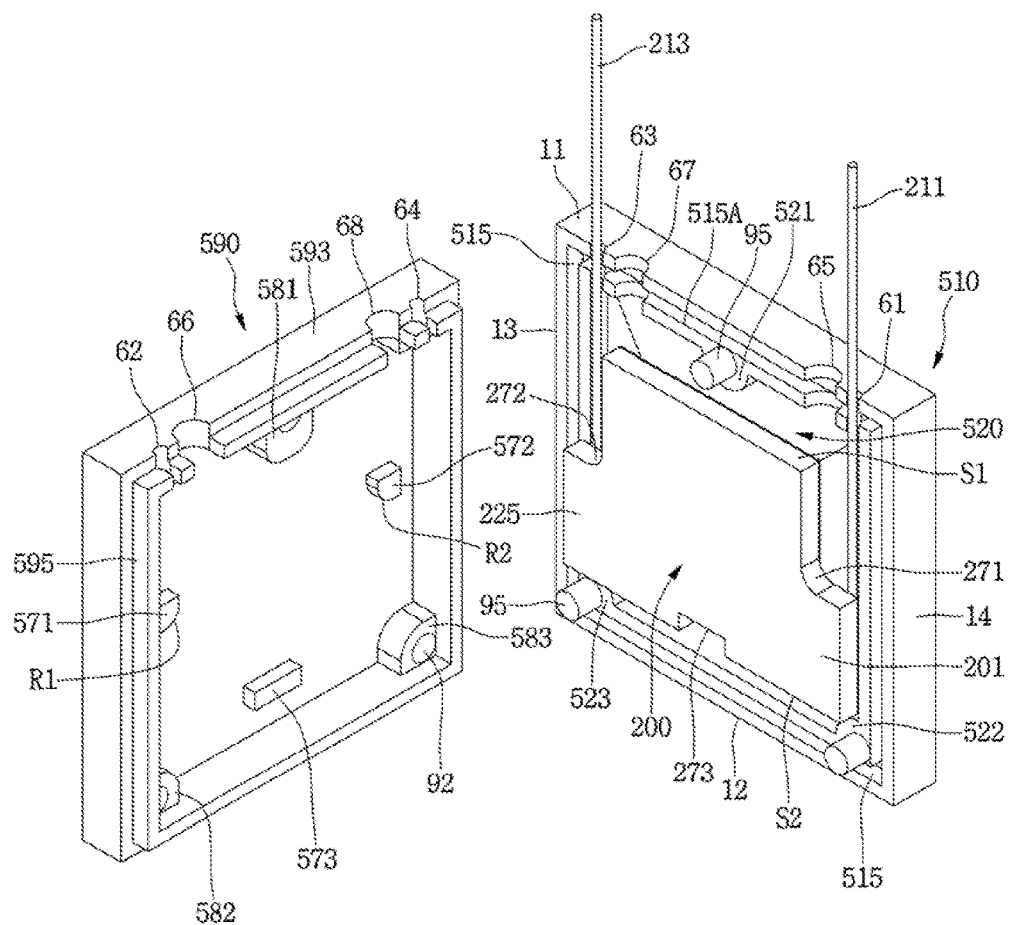

LIGHT SOURCE UNIT

CROSS REFERENCE TO RELATED APPLICATIONS

This application is the National Phase of PCT International Application No. PCT/KR2016/000897, filed on Jan. 27, 2016, which claims priority under 35 U.S.C. 119(a) to Patent Application No. 10-2015-0013359, filed in the Republic of Korea on Jan. 28, 2015, all of which are hereby expressly incorporated by reference into the present application.

TECHNICAL FIELD

A present embodiment relates to a light source unit.

The embodiment provides a light source unit having a waterproof and moisture-proof member.

BACKGROUND ART

Light-emitting diodes (LEDs) can be formed using a compound semiconductor material such as GaAs-based, AlGaAs-based, GaN-based, InGaN-based and InGaAlP-based materials.

Such a light-emitting diode is used as a light-emitting device that is packaged and emits various colors and the light-emitting device is used as a light source in various applications such as a light indicator to indicate color, a character indicator, and an image indicator.

In particular, ultraviolet ray emitting diodes (UV LEDs) can be used for sterilization, purification or the like in a case of a short wavelength, and can be used in a light-emitting apparatus or a curing apparatus in a case of a long wavelength. However, since an environment in which the ultraviolet ray emitting diode using the short wavelength is applied is often high humidity or underwater, the apparatus may be defective due to deterioration of a moisture-proof and waterproof function thereof and the operation reliability may be decreased.

DISCLOSURE

Technical Problem

An embodiment provides a light source module having a new waterproof and moisture-proof structure.

The embodiment provides a light source module in which a moisture-proof film is adhered to a light-emitting device and a substrate.

The embodiment provides a light source module in which a moisture-proof film including fluorine is disposed on a light-emitting device having an ultraviolet ray emitting chip.

The embodiment provides a light source unit having a resin member which surrounds a light source module between a first cover and a second cover.

The embodiment provides a light source unit having a resin member for surrounding the light source module and a fixing frame for fixing the light source module between the first cover and the second cover.

The embodiment can improve reliability of the light source unit having the ultraviolet ray source module.

Technical Solution

A light source unit according to the embodiment includes: a first cover which has an open region; a second cover which is coupled to the first cover; a light source module which is disposed between the first cover and the second cover and has a light-emitting device disposed on the open region and a circuit board on which the light-emitting device is disposed; a fixing frame which is disposed between the second cover and the circuit board; and a resin member which is filled in an region between the first cover and the second cover and supports the light source module and the fixing frame, in which the light source module includes a moisture-proof film which covers an upper surface and side surfaces of the light-emitting device and extends to an upper surface of the circuit board.

The light source unit according to the embodiment includes: a first cover which has an open region; a second cover which is coupled to the first cover; a light source module which is disposed between the first cover and the second cover and has a light-emitting device disposed on the open region and a circuit substrate disposed between the light-emitting device and the second cover; a plurality of engaging jaws which support an outside of the circuit board to an inside of at least one of the first cover and the second cover; and a resin member which is filled in an region between the first cover and the second cover and supports the light source module and, in which the light source module includes a moisture-proof film which covers an upper surface and side surfaces of the light-emitting device and extends to an upper surface of the circuit board and the circuit board is in contact with an upper surface of the second cover.

Advantageous Effects

The light source unit according to the embodiment can be provided as a waterproof unit in a product which is applied to a high humidity and underwater environment.

In the light source unit according to the embodiment, since the light-emitting device is laminated and sealed by a moisture-proof film/a resin member/a cover member, reliability as a moisture-proof device can be improved.

The light source unit according to the embodiment can be provided as a sterilizing apparatus in a high humidity and underwater environment.

DESCRIPTION OF DRAWINGS

FIG. 1 is a perspective view illustrating an example of a light-emitting device according to an embodiment.

FIG. 2 is a perspective view illustrating a state where a transparent window is removed from the light-emitting device of FIG. 1.

FIG. 3 is a plan view illustrating a state where a transparent window is removed from the light-emitting device of FIG. 1.

FIG. 4 is a rear view illustrating the light-emitting device of FIG. 1.

FIG. 5 is a cross-sectional view taken along line A-A of the light-emitting device of FIG. 1.

FIG. 6 is a cross-sectional view taken along line B-B of the light-emitting device of FIG. 3.

FIG. 7 is a view illustrating another example of the light-emitting device of FIG. 5.

FIG. 8 is a side sectional view illustrating an example in which the light-emitting device and a waterproof film are disposed on a circuit board, as a light source module according to an embodiment.

FIG. 9 is a perspective view illustrating a light source unit having a light source module according to the first embodiment.

FIG. 10 is a cross-sectional view taken along line C-C of the light source module of FIG. 9.

FIG. 11 is a partially enlarged view illustrating the light source unit of FIG. 10.

FIG. 12 is an exploded perspective view of components in which the resin member is removed from the light source unit of FIG. 9.

FIG. 13 is a front view illustrating a front surface of the fixing frame of the light source unit of FIG. 12.

FIG. 14 is a view illustrating a rear surface of the fixing frame of the light source unit of FIG. 12.

FIG. 15 is a view illustrating a first cover of the light source unit of FIG. 12.

FIG. 16 is a view illustrating a state where the light source module and the fixing frame are coupled to the first cover in the light source unit of FIG. 12.

FIG. 17 is an exploded perspective view illustrating the first cover and the second cover of the light source unit of FIG. 12.

FIG. 18 is a coupled state view illustrating the light source unit of FIG. 9.

FIG. 19 is a perspective view illustrating a light source unit having a light source module according to a second embodiment.

FIG. 20 is a sectional view taken along line D-D of the light source unit of FIG. 19.

FIG. 21 is an exploded perspective view of components in which the resin member is removed from the light source unit of FIG. 19.

FIG. 22 is an exploded perspective view illustrating a state before the fixing frame is coupled to the first cover of FIG. 21.

FIG. 23 is a perspective view illustrating a state where the first cover and the second cover are disassembled in the light source unit of FIG. 21.

FIG. 24 is a perspective view illustrating a light source unit having a light source module according to a third embodiment.

FIG. 25 is a cross-sectional view taken along line E-E of the light source unit of FIG. 23.

FIG. 26 is an exploded perspective view illustrating components in which the resin member is removed from the light source unit of FIG. 24.

FIG. 27 is a perspective view of a state where the first cover and the second cover are disassembled from the light source unit of FIG. 26.

BEST MODE

Hereinafter, embodiments of the present invention will be described in detail with reference to the accompanying drawings so as to be easily carried out the present invention by those of ordinary skill in the art to which the invention pertains. However, the present invention may be embodied in many different forms and is not limited to the embodiments described herein.

Throughout the specification, when it is stated a portion "includes" a certain component, this means that it does not exclude other components unless specifically stated otherwise, but may also further include other components. In order to clearly explain the present invention in the drawings, portions which are not related to the description are omitted and similar portions are denoted by similar reference numerals throughout the specification.

In the description of an embodiment, when a portion such as a layer, a film, an region, and a plate is referred to as being "on" another portion, it includes not only a case where it is "directly on" another portion but also a case where there is another portion therebetween. On the contrary, when a portion is "directly on" another portion, it means that there is no other portion therebetween.

<Light-emitting Device>

With reference to FIG. 1 to FIG. 6, a light-emitting device according to an embodiment of the present invention will be described. FIG. 1 is a perspective view illustrating an example of a light-emitting device according to an embodiment, FIG. 2 is a perspective view illustrating a state where a transparent window is removed from the light-emitting device of FIG. 1, FIG. 3 is a plan view illustrating a state where a transparent window is removed from the light-emitting device of FIG. 1, FIG. 4 is a rear view illustrating the light-emitting device of FIG. 1, FIG. 5 is a cross-sectional view taken along line A-A of the light-emitting device of FIG. 1.

With reference to FIG. 1 to FIG. 6, the light-emitting device 100 includes a body 110 which has a recess 111; a plurality of electrodes 121, 123, and 125 which are disposed in the recess 111; a light-emitting chip 131 which is disposed on at least one of the plurality of electrodes 121, 123, 125; and a transparent window 161 which is disposed on the recess 111.

The light-emitting chip 131 may include a selective peak wavelength in the range of ultraviolet ray wavelength to visible wavelength. The light-emitting chip 131 may emit UV-C wavelengths, that is, ultraviolet ray in the range of 100 nm to 280 nm, for example.

The body 110 includes an insulating material such as a ceramic material. The ceramic material includes a low temperature co-fired ceramic (LTCC) or a high temperature co-fired ceramic (HTCC) which are co-fired. The material of the body 110 may be, for example, AN and may be made of a metal nitride having a thermal conductivity of 140 W mK or more.

As illustrated in FIG. 5 and FIG. 6, a connection pattern 117 may be disposed in the body 110 and the connection pattern 117 may provide an electric connection path between the recess 111 and a lower surface of the body 110.

The body 110 includes a stepped structure 115 inside an upper portion thereof. The stepped structure 115 is a region lower than the upper surface of the body 110 and is disposed on the periphery of the upper portion of the recess 111. Although the depth of the stepped structure 115 is a depth from the upper surface of the body 110 and may be greater than the thickness of the transparent window 161, it is not limited thereto.

The recess 111 is a region where a portion of the upper region of the body 110 is opened and may be formed at a predetermined depth from the upper surface of the body 110. The recess 111 may be disposed in a center region of the body 110. For example, the bottom of the recess 111 may be deeper than the stepped structure 115 of the body 110. A position of the stepped structure 115 may be disposed in consideration of the height of the first connection member 135 connected to the light-emitting chip 131 disposed on the bottom of the recess 111. Here, a direction in which the recess 111 is opened may be a direction in which light generated from the light-emitting chip 131 is emitted, for example, an upward direction.

A top view shape of the recess 111 may include a polygonal shape, a circular shape, or an elliptical shape. An edge portion of the recess 111 may have a chamfered shape, for example, a curved shape. Here, the recess 111 may be located inside the stepped structure 115 of the body 110.

A width of the lower portion of the recess 111 may be the same as or may be narrower than the width of the upper portion of the recess 111. In addition, a sidewall 116 of the recess 111 may be formed to be perpendicular or inclined to an extension line of the bottom surface of the recess 111.

As illustrated in FIG. 2 and FIG. 3, a plurality of sub-recesses 112 and 113 may be disposed in the recess 111. The bottom surfaces of the respective sub-recesses 112 and 113 may be disposed at a lower depth than the bottom surface of the recess 111. The spacing between the plurality of sub-recesses 112 and 113 may be spaced apart from each other to be greater than the width of any one of the sides of the light-emitting chip 131. A protection device 133 may be disposed on at least one of the plurality of sub-recesses 112 and 113. The depth of the respective sub-recesses 112 and 113 may be formed to be equal to or greater than the thickness of the protection device 133. The depth of the sub-recesses 112 and 113 may be formed in a depth that the upper surface of the protection device 133 does not protrude above the bottom surface of the recess 111. Since the protection device 133 is disposed on at least one of the sub-recesses 112 and 113 and the protection device 133 does not protrude above the bottom surface of the recess 111, absorption of the light which is emitted from the light-emitting chip 131 into the protection device 133 can be prevented. Accordingly, decrease in a light extraction efficiency of the light-emitting device 100 and distortion of light directing characteristics can be prevented.

The plurality of sub-recesses 112 and 113 are disposed on the opposite sides to each other with respect to the light-emitting chip 131. Accordingly, heat generated from the light-emitting chip 131 can be diffused uniformly in the recess 111, thereby improving the heat resistance of the light-emitting device 100. As another example, a protection device 133 is disposed as one of the plurality of sub-recesses 112 and 113 and a dummy can be used as the other one thereof. The protection device 133 includes a zener diode. The protection device 133 is connected in parallel to the light-emitting chip 131 to electrically protect the light-emitting chip 131. As another example, the sub-recesses 112 and 113 may not be formed in the recess 111 and in this case, the protection device 133 may be removed or disposed at the bottom of the recess 111.

The electrodes 121, 123 and 125 may be disposed in the recess 111 and the electrodes 121, 123 and 125 may be selectively connected to the light-emitting chip 131. The electrodes 127 and 129 may be disposed on the sub-recesses 112 and 113 and the electrodes 127 and 129 may be selectively connected to the protection device 133. The electrodes 121, 123, 125, 127, and 129 selectively supply power to the light-emitting chip 131 and the protection device 133. The electrodes 121, 123, 125, 127 and 129 may selectively include a metal such as Platinum (Pt), titanium (Ti), copper (Cu), nickel (Ni), gold (Au), tantalum (Ta), aluminum (Al). At least one or all of the electrodes 121, 123, 125, 127, and 129 may be formed as a single layer or multiple layers. In the multilayered electrode, gold (Au) material having good bonding can be disposed on the uppermost layer thereof, titanium (Ti), chromium (Cr), and tantalum (Ta) material having good adhesion to the body 110 can be disposed on the lowermost layer thereof, and platinum (Pt), nickel (Ni), copper (Cu), or the like may be disposed on the intermediate layer between the uppermost layer and the lowermost layer thereof. It is not limited to a laminated structure of such electrodes.

Specifically, the electrodes 121, 123, and 125 disposed on the bottom of the recess 111 may include a first electrode 121 on which the light-emitting chip 131 is disposed and a second electrode 123 and a third electrode 125 which are spaced apart from the first electrode 121. The first electrode 121 may be disposed at the center of the bottom of the recess 111 and the second electrode 123 and the third electrode 125 may be disposed at both sides of the first electrode 121. Although any one of the first electrode 121 and the second electrode 123 may be removed, it is not limited thereto. Although the light-emitting chip 131 may be disposed on plurality electrodes of the first to third electrodes 121, 123, and 125, it is not limited thereto. The second electrode 123 and the third electrode 125 may be supplied with power of a first polarity and the first electrode 121 may be supplied with a power of a second polarity.

When the fourth fifth electrodes 127 and 129 disposed in the respective sub-recesses 112 and 113 will be described, one of the fourth electrode 127 and fifth electrode 129, for example the fourth electrode 127 may be electrically connected to the protection device 133. The fourth and fifth electrodes 121, 127, and 129 may be supplied with power of a second polarity.

Although the polarities of the first to fifth electrodes 121, 123, 125, 127, and 129 may vary depending on the electrode pattern and the connection method with the respective devices, it is not limited thereto. Here, in a case where the first electrode 121 is not electrically connected to the light-emitting chip 131, the first electrode may be used as a non-polar metal layer or a heat dissipation plate. In addition, although each of the electrodes 121, 123, 125, 127, and 129 may be defined as a metal layer, it is not limited thereto.

The body 110 includes a connection pattern 117 thereon and the connection pattern 117 may be selectively connected to different electrodes from each other, for example, according to the polarity. The connection pattern 117 may electrically connect a portion 121A of the first electrode 121 extending to the inside of the body 110 to another electrode, for example. In this way, at least one or all of the first to third electrodes 121, 123, and 125 may be selectively connected to the connection pattern 117 in the body 110. At least one or both of the fourth and fifth electrodes 127 and 129 may be selectively connected to the connection pattern 117 in the body 110. For example, although any one of the connection patterns 117 connects the first electrode 121, the fourth and fifth electrodes 127 and 129 and the first pad 141 to each other and the other one of the connection patterns 177 may connect the second and third electrodes 127 and 129 and the second pad 145 to each other, it is not limited thereto.

As illustrated in FIG. 4 to FIG. 6, a plurality of pads 141 and 145 are disposed on the lower surface of the body 110. The plurality of pads 141 and 145 include a first pad 141 and a second pad 145, for example and the first and second pads 141 and 145 may be disposed to be spaced apart from each other on a lower surface of the body 110. Although at least one of the first and second pads 141 and 145 may be disposed in plural to disperse a current path, it is not limited thereto.

A heat dissipation member (not illustrated) may be disposed in the body 110. The heat dissipation member may be disposed below the light-emitting chip 131, that is, below the first electrode 121, to dissipate heat generated from the light-emitting chip 131. The material of the heat dissipation member may be a metal, for example, an alloy.

The light-emitting chip 131 may be disposed in the recess 111. The light-emitting chip 131 may be an ultraviolet ray emitting diode, and may be an ultraviolet ray emitting diode having a wavelength ranging from 100 nm to 280 nm. In other words, the light-emitting chip 131 can emit short-wavelength ultraviolet ray of 280 nm or less. The ultraviolet ray wavelength has an effect of reducing various biological contaminants such as germ, bacteria, viruses and the like.

The light-emitting chip 131 may be bonded to the first electrode 121 by a conductive adhesive and may be connected to the second electrode 123 by a first connection member 135. The light-emitting chip 131 may be electrically connected to the first electrode 121 and the second electrode 123 or the third electrode 125. The connection method of the light-emitting chip 131 may be connected by selectively using wire bonding, die bonding, and flip bonding methods and such a bonding method may be changed depending on the chip type and the electrode position of the chip. The protection device 133 may be bonded to the fourth electrode 127 and may be connected to the third electrode 125 by a second connection member 137 and may be electrically connected to the third electrode 125 and the fourth electrode 127. The first and second connection members 135 and 137 include, for example, a wire.

The light-emitting chip 131 may be formed of a compound semiconductor of Group II and VI elements, or a compound semiconductor of Group III and V elements. The light-emitting device may selectively include a semiconductor light-emitting device manufactured using compound semiconductors such as AlInGaN, InGaN, AlGaN, GaN, GaAs, InGaP, AlInGaP, InP and InGaAs-based compound semiconductor. The light-emitting chip 131 may include an n-type semiconductor layer, a p-type semiconductor layer, and an active layer and can be implemented in pairs such as an InGaN/GaN, InGaN/AlGaN, InGaN/InGaN, GaN/AlGaN, AlGaN/AlGaN, InAlGaN/InAlGaN, AlGaAs/GaAs, InGaAs/GaAs, InGaP/GaP, AlInGaP/InGaP, and InP/GaAs.

As illustrated in FIG. 1, FIG. 5 and FIG. 6, the transparent window 161 is disposed on the recess 111. The transparent window 161 includes a glass material such as quartz glass. Accordingly, the transparent window 161 can be defined as a material that can transmit the light emitted from the light-emitting chip 131 without damages such as intermolecular bond breakdown due to the ultraviolet ray wavelength, for example.

The outer periphery of the transparent window 161 may be coupled to the stepped structure 115 of the body 110. An adhesive layer 163 may be disposed between the transparent window 161 and the stepped structure 115 of the body 110 and the adhesive layer 163 includes a resin material such as silicone and epoxy. The transparent window 161 is formed to have a width larger than the bottom width of the recess 111 to prevent light leakage. The lower surface area of the transparent window 161 may be larger than the bottom area of the recess 111. Accordingly, the transparent window 161 can be easily coupled to the stepped structure 115 of the body 110.

The transparent window 161 may be spaced apart from the light-emitting chip 131. The expansion of the transparent window 161 by heat generated from the light-emitting chip 131 can be prevented by the transparent window 161 being spaced apart from the light-emitting chip 131. Although the space under the transparent window 161 may be an empty space or filled with a non-metallic or metallic chemical element, it is not limited thereto. Although lens may be coupled to the transparent window 161, it is not limited thereto. In addition, a molding member may be further disposed on the side surface of the body 110 to perform moisture-proof and device protection.

FIG. 7 is another example of the light-emitting device of FIG. 5. FIG. 7 illustrates an example in which a moisture-proof layer is disposed in the light-emitting device of FIG. 5.

With reference to FIG. 7, the light-emitting device may include a moisture-proof layer 171. The moisture-proof layer 171 may be disposed on the recess 111 of the body 110. The moisture-proof layer 171 having a thickness which can covers the upper surface of the light-emitting chip 131 may be disposed. For example, the moisture-proof layer 171 may have a thickness greater than that of the light-emitting chip 131 and may be formed on the light-emitting chip 131. The moisture-proof layer 171 protects the light-emitting chip 131 and the electrodes from moisture or humidity.

The moisture-proof layer 171 may include fluorine. The fluorine has a strong chemical bonding force with carbon and does not cause intermolecular bond breakdown due to ultraviolet ray. The moisture-proof layer 171 may be defined as a fluororesin-based layer, the molecular chain of the moisture-proof layer 171 is a helical structure, since the structure of the molecular chain is a three-dimensional helical structure and thus fluorine atoms block surrounding of the carbon-carbon bond without intervals, the destruction of molecular chains due to penetration of ultraviolet ray and oxygen can be prevented. In addition, the moisture-proof layer 171 can protect the material since the moisture-proof layer 171 can block penetration of moisture such as oxygen, water, and oil to the surface of the material as much as possible. The moisture-proof layer 171 is made of a light-transmitting material and can transmit light emitted from the light-emitting chip 131.

In addition, the moisture-proof layer 171 may use as at least one of polychlorotrifluoroethylene (PCTFE), Ethylene+Tetrafluoroethylene (ETFE), fluorinated ethylene propylene copolymer (FEP) and Perfluoroalkoxy (PFA), for example. Here, transmittance at ultraviolet ray wavelength becomes higher in the order of PCTFE, ETFE, FEP, and PFA and moisture absorption rate at ultraviolet ray wavelength becomes higher in the order of PCTFE, FEP and PFA. The embodiment can be used as a moisture-proof layer using at least one of PCTFE, FEP and PFA.

The moisture-proof layer 171 is disposed on the surface of the light-emitting chip 131 and may extend to the bottom surface of the recess 111. The moisture-proof layer 171 may extend from the bottom of the recess 111 to the sidewall 116. The moisture-proof layer 171 seals upper and side surfaces of the light-emitting chip 131 and the bottom surface and the sidewalls 116 of the recess 111 to protect the light-emitting chip 131 from moisture or moisture.

The moisture-proof layer 171 blocks moisture penetration into the interface between the light-emitting chip 131 and the bottom surface of the recess 111.

The moisture-proof layer 171 seals the plurality of electrodes 121, 123, and 125 and the protection device 133 (FIG. 6). The moisture-proof layer 171 may seal the sub-recesses 112 and 113 illustrated in FIG. 6, may protect the fourth and fifth electrodes 127 and 129 and the protection device 133, and can block the moisture penetrating into the protection element 133. Accordingly, since the moisture-proof layer is effective for moisture-proofing in the recess 111, a water-resistant light-emitting device can be provided.

By being used the moisture-proof layer 171 as a fluorine resin-based material, the deterioration of the light extraction efficiency can be minimized since there is no damage such as intermolecular bond breakdown by ultraviolet ray wavelength emitted from the light-emitting chip 131.

The thickness of the moisture-proof layer 171 may be equal to or less than 1 mm and the thickness thereof may be a thickness for at least covering the light-emitting chip 131. When the thickness of the moisture-proof layer 171 exceeds 1 mm, the transmittance of the ultraviolet ray wavelength may be reduced. The moisture-proof layer 171 according to the embodiment may have a transmittance of 70% to 95% with respect to the wavelength emitted from the light-emitting chip 131. If the transmittance of the moisture-proof layer 171 is less than 70%, the optical reliability may be decreased due to the deterioration of the function. The moisture-proof layer 171 of such a light-emitting device can transmit the light emitted from the light-emitting chip 131 without damage thereof.

<Light Source Module>

FIG. 8 is a view illustrating a light source module having the light-emitting device of FIG. 1.

With reference to FIG. 8, the light source module according to the embodiment includes a light-emitting device 100, a circuit board 201 on which the light-emitting device 100 is disposed, and a moisture-proof film 175 which covers the light-emitting device 100 and the circuit board 201.

The light-emitting device 100 includes a body 110 which has a recess 111, a plurality of electrodes 121, 123, and 125 which are disposed in the recess 111, and a plurality of light-emitting chips 131 which are disposed on at least one of the plurality of electrodes 121, 123, and 125, and a transparent window 161 which is disposed on the recess 111.

Although the light-emitting chip 131 may emit an ultraviolet ray wavelength, that is, an ultraviolet ray wavelength in a range of 100 nm to 280 nm, it is not limited thereto. The light-emitting chips 131 may be disposed in a flip chip manner or may be disposed by die bonding. The transparent window 161 may be made of a glass material in which there is no damage such as intermolecular bond breakdown by the ultraviolet ray wavelength. The configuration of such a light-emitting device 100 will be described with reference to the description of the embodiment disclosed above.

The circuit board 201 includes a plurality of bonding pads 204 and 205 and the plurality of bonding pads 204 and 205 can be electrically connected to the first and second pads 141 and 145 disposed on the lower surface of the body 110.

The circuit board 201 may be connected to the signal cables 211 and 213 via external connection terminals 207 and 208 and the signal cables 211 and 213 may supply power from the outside.

The moisture-proof film 175 may be disposed on the upper surface and the side surfaces of the light-emitting device 100 and the upper surface of the circuit board 201. The moisture-proof film 175 may be disposed on the upper surface of the transparent window 161 of the light-emitting device 100, the upper surface and the side surfaces of the body 110. The extending portion 71 of the moisture-proof film 175 extends from the side surfaces of the body 110 to the upper surface of the circuit board 201 and is disposed thereon.

The moisture-proof film 175 includes a fluororesin-based material and can transmit the light without being broken by the light emitted from the light-emitting chip 131. At least one of polychlorotrifluoroethylene (PCTFE), ethylene+tetrafluoroethylene (ETFE), fluorinated ethylene propylene copolymer (FEP), Perfluoroalkoxy (PFA), and the like may be used as the moisture-proof film 175.

The moisture-proof film 175 may block moisture or humidity penetrating into the circuit board 201 as well as moisture or humidity penetrating through the side surfaces and the upper surface of the light-emitting device 100. The thickness of the moisture-proof film 175 may be formed in a range of 0.5 μm to 10 μm and when the thickness of the moisture-proof layer 175 exceeds the above range, the light transmittance may be remarkably decreased and when the thickness of the moisture-proof film 175 is less than the range moisture resistance may be decreased.

As another example, the moisture-proof material may be disposed in a region between the lower surface of the light-emitting device 100 and the circuit board 201. The moisture-proof material may block moisture or humidity penetration to a region between the lower surface of the light-emitting device 100 and the circuit board 201.

The moisture-proof film 175 may be spaced apart from the bonding regions between the external connection terminals 207 and 208 and the signal cables 211 and 213. As another example, the moisture-proof film 175 may cover the external connection terminals 207 and 208. In this case, the moisture-proof film 175 can prevent the penetration of moisture or humidity through the external connection terminals 207 and 208.

<Light Source Unit>

FIG. 9 is a perspective view illustrating a light source unit having a light source module according to the first embodiment, FIG. 10 is a cross-sectional view taken along line C-C of the light source module of FIG. 9, FIG. 11 is a partially enlarged view illustrating the light source unit of FIG. 10, FIG. 12 is an exploded perspective view of components in which the resin member is removed from the light source unit of FIG. 9, FIG. 13 is a view illustrating a front surface of a fixing frame of the light source unit of FIG. 12, FIG. 14 is a view illustrating a rear surface of the fixing frame of the light source unit of FIG. 12, FIG. 15 is a view illustrating a first cover of the light source unit of FIG. 12, FIG. 16 is a view illustrating a state where the light source module and the fixing frame are coupled to the first cover in the light source unit of FIG. 12, FIG. 17 is an exploded perspective view illustrating the first cover and the second cover of the light source unit of FIG. 12, and FIG. 18 is a coupled state view illustrating the light source unit of FIG. 9.

With reference to FIG. 9 to FIG. 18, the light source unit 300 includes the light source module 200 according to the embodiment, a first cover 310 which has an open region 305 through which the light emitted from the light source module 200 is emitted and covers the light source module 200, a second cover 390 which is coupled to the first cover 310, a resin member 340 which is disposed in the first cover 310 and the second cover 390, and a fixing frame 350 which is disposed between the light source module 200 and the second cover 390.

The light source unit 300 seals the light source module 200 in the first and second covers 310 and 390, leads out the signal cables 211 and 213 connected to the light source module 200 to the outside, and supplies power to the power source module 200 through the signal cables 211 and 213. The light-emitting device 100 of the light source module 200 may emit a selective wavelength within a range of ultraviolet ray to visible ray according to the embodiment and may emit ultraviolet ray, for example. The ultraviolet ray may include a UV-C wavelength.

The first and second covers 310 and 390 may be made of at least one of glass, plastic, polypropylene (PP), polyethylene (PE), polycarbonate (PC), polybutylene terephthalate (PBT), Poly Oxy Methylene, Polyacetal (POM), polyphenylene oxide (PPO), resin, or modified PPO resin. Here, modified PPO resin includes a resin in which PPO is mixed with a resin such as polystyrene (PS) or polyamide series (PA)-based resin, and has heat resistance and has a feature of stably maintaining the physical properties even at a low temperature. As another example, although the second cover 390 may be made of metal, it is not limited thereto.

Although top view shapes of the outer shapes of the first and second covers 310 and 390 may be a polygonal shape or a circular shape, it is not limited thereto.

With reference to FIG. 9 and FIG. 10, the first cover 310 includes a recess portion 302 having an open region 305 and an accommodation region 320 therein.

The recess portion 302 is recessed lower than the outer upper surface 301 of the first cover 310. The recess portion 302 is disposed inside the outer upper surface 301 of the first cover 310 and the depth of the surface thereof may be gradually lowered. The bottom surface of the recess portion 302 may include an inclined surface from the outer upper surface 301 of the first cover 310 to the open region 305 or may include a curved surface having a predetermined curvature. The bottom surface of the recess portion 302 may include surfaces whose edge portions have a predetermined curvature. The recess portion 302 has a gradually lower depth toward the center portion thereof.

As another example, although the entire region of the upper surface of the first cover 310 may be disposed as a flat surface, it is not limited thereto. As another example, an optical lens (not illustrated) may be disposed on the open region 305 of the first cover 310, and the material of the optical lens may include glass, silicon, or epoxy material.

The open region 305 of the first cover 310 may be formed to be opened at the center portion of the bottom of the recess portion 302. The light-emitting device 100 of the light source module 200 coupled between the first and second covers 310 and 390 is disposed in the open region 305. The upper portion of the light-emitting device 100 of the light source module 200 may protrude through the open region 305. The moisture-proof film 175 covering the upper and side surfaces of the light-emitting device 100 may be exposed in the open region 305 without directly exposing the surface of the light-emitting device 100. In other words, the moisture-proof film 175 may be exposed to the open region 305. Although the width or the area of the open region 305 may be disposed to be larger than the width or the upper surface area of the light-emitting device 100, it is not limited thereto.

The outer shape of the open region 305 may have the same shape as the outer shape of the light-emitting device 100. Although the outer shape of the open region 305 may include a circular shape or a polygonal shape, it is not limited thereto.

The moisture-proof film 175 and the sidewalls of the open region 305 may be in contact with each other or spaced apart from each other with a predetermined interval. In a case where the moisture-proof film 175 and the sidewalls of the open region 305 are in contact with each other, the moisture-proof efficiency can be improved.

The moisture-proof film 175 covers the upper surface and the side surfaces of the light-emitting device 100, and the extending portion 71 thereof extends to the upper surface of the circuit board 201.

Here, as illustrated in FIG. 10, the sidewalls of the open region 305 includes protrusions 307, and the sidewall protrusions 307 may protrude along the periphery of the light-emitting device 100 in the direction of the upper surface of the circuit board 201. The sidewall protrusion 307 of the open region 305 may include a side cross-section having a semicircular or polygonal shape. The sidewall protrusion 307 of the open region 305 may be in contact with the extending portion 71 of the moisture-proof film 175. Since the interfaces between the extending portion 71 of the moisture-proof film 175 and the sidewall protrusion 307 of the open region 305 are in contact with each other, the open region 305, penetration of moisture or water through the open region 305 can be prevented.

The sidewall protrusion 307 of the open region 305 and the extending portion 71 of the moisture-proof film 175 may be in contact with the resin member 340. The resin member 340 is filled in the region between the first cover 310 and the circuit board 201 and may be spaced apart from the moisture-proof film 175 disposed on the side surface of the light-emitting device 100. The sidewall protrusion 307 prevents exposure of the resin member 340 to the open region 305 and prevents the penetration of moisture or water from the outside.

As another example, the sidewall protrusion 307 of the open region 305 and the extending portion 71 of the moisture-proof film 175 may have a predetermined interval therebetween. In this case, the resin member 340 is in contact with the moisture-proof film 175 which is disposed on the side surfaces of the light-emitting device 100 through the region between the sidewall protrusion 307 of the open region 305 and the extending portion 71 of the moisture-proof film 175. The resin member 340 can prevent the penetration of moisture or water from the outside in the open region 305.

As illustrated in FIG. 10 and FIG. 11, side portions 11, 12, 13, and 14 of the first cover 310 and side portions 393 of the second cover 390 have a stepped structure and can be combined with each other or can be matched each other. The side portions 11, 12, 13 and 14 have inner ribs 314 and are coupled with the side portions 393 of the second cover 390. As illustrated in FIG. 15 and FIG. 16, the inner rib 314 includes a plurality of rib protrusions 315, and the plurality of rib protrusions 315 protrude in a direction opposite to the upper surface 301 of the first cover 310, that is, in the direction of the second cover 390. Although the plurality of rib protrusions 315 may be spaced apart from each other along the inner ribs 314 and thus be disposed therebetween, it is not limited thereto. The plurality of rib protrusions 315 can enhance the matching between the first cover 310 and the second cover 390.

As illustrated in FIG. 10, FIG. 12 and FIG. 17, the second cover 390 includes a plurality of protrusion grooves 395 having a lower depth than the upper surface of the second cover 390 in the outer periphery thereof. The rib protrusion 315 is engaged with the protrusion groove 395. The protrusion groove 395 has a depth at which a portion of the rib protrusion 315 can be inserted. The plurality of protruding grooves 395 may have a polygonal or semicircular side cross-sectional shape.

As illustrated in FIG. 11, the height B1 of the rib protrusion 315 of the inner rib 314 of the first cover 310 can be higher than the depth B2 of the protrusion groove 395 of the second cover 390. Accordingly, the lower surface of the inner ribs 314 of the side portions 11, 12, 13 and 14 of the first cover 310 may be spaced apart from the upper surface of the second cover 390. In this case, the resin member 340 is filled between the lower surface of the inner rib 314 and the upper surface of the second cover 390 and can be adhered to each other.

The inner rib 314 and the rib protrusion 315 of the first cover 310 are spaced apart from the inner surface of the side portion 393 of the second cover 390. The protrusion groove 395 of the second cover 390 is disposed to be spaced apart from the inner surface of the side portion 393 of the second cover 390. Accordingly, the outside portion of the resin member 340 341 is disposed on the region 322 between the inner rib 314 and the rib, protrusion 315 of the first cover 310 and the side portion 393 of the second cover 390. The outside portion 341 of the resin member 340 may extend through the region between the plurality of rib protrusions 315 and may be adhered to each other.

The outside portion 341 of the resin member 340 is adhered to a region between the inner region of the side portions 11,12,13 and 14 of the first cover 310 and the side portion 393 of the second cover 390 and fixes and supports the first and second covers 310 and 390.

As illustrated in FIG. 10, FIG. 12, FIG. 15, and FIG. 16, a light source module 200 having the light-emitting device 100 and a fixing frame 350 which is disposed below the light source module 200 are disposed on an accommodation region 320 of the first cover 310. The fixing frame 350 may be disposed between the circuit board 201 of the light source module 200 and the second cover 390.

The fixing frame 350 fixes the light source module 200 to the first cover 310. The fixing frame 350 may include a material having a thermal conductivity higher than that of the resin material included in the circuit board 201. The fixing frame 350 may include at least one of a metal material and a non-metallic material such as resin or ceramic.

The fixing frame 350 may function as a heat radiating member, for example, dissipates heat conducted from the circuit board 201. The fixing frame 350 maintains an interval between the second cover 390 and the circuit board 201.

The resin member 340 is filled in the region between the first and second covers 310 and 390 to seal the region between the first and second covers 310 and 390. The resin member 340 may prevent movement of the components disposed between the first and second covers 310 and 390. For example, the resin member 340 is in contact with the moisture-proof film 175, the circuit board 201, the fixing frame 350, and the inner surfaces of the first and second covers 310 and 390 and fixes the light source module 200, the fixing frame 350, and the first and second covers 310 and 390.

The resin member 340 may be molded in a region other than the region of the moisture-proof film 175 disposed on the upper and side surfaces of the light-emitting device 100 in the entire region of the light source module 200. Since the resin member 340 seals the surface of the light source module 200, penetration of moisture or water from the outside of the light source unit 300 can be prevented.

Hereinafter, the coupling structure of the light source module 200 and the fixing frame 350 in the light source unit 300 will be described.

As illustrated in FIG. 12 and FIG. 15, the first cover 310 includes a plurality of engaging jaws 321, 322, and 323 inside thereof. The plurality of engaging jaws 321, 322 and 323 protrude from the inside of the first cover 310 in a direction of the second cover 390. The plurality of engaging jaws 321, 322, and 323 support an outer periphery of the circuit board 201 of the light source module 200. The plurality of engaging jaws 321, 322, and 323 can support at least two, for example, at least three different regions of the outer periphery of the circuit board 201 from each other.

The plurality of engaging jaws 321, 322 and 323 include first and second engaging jaws 321 and 322 disposed at both edge regions of a first side surface S1 of the circuit board 201 and a third engaging jaw 323 disposed on the second side surface S2 disposed on the opposite side thereto. The plurality of engaging jaws 321, 322, and 323 prevent the movement of the circuit board 201 to the outside.

As another example, a plurality of grooves (not illustrated) may be formed on different sides of the circuit board 201 from each other and protrusions (not illustrated) may be provided on the first cover 310 to correspond to the grooves and the each groove in the circuit board 201 may be matched the protrusion of the first cover 310. Accordingly, the movement of the circuit board 201 can be decreased.

When the circuit board 201 of the light source module 200 is coupled, the light-emitting device 100 is inserted into the open region 305 of the recess portion 302. Here, as illustrated in FIG. 10, the sidewall protrusions 307 of the open region 305 protrude in the direction of the upper surface of the circuit board 201 and can be in contact with the extending portion 71 of the moisture-proof film 175 disposed on the circuit board 201. Accordingly, the penetration of a portion of the resin member 340 into the open region 305 can be prevented.

When the circuit board 201 is coupled to the accommodation region 320 of the first cover 310, the fixing frame 350 is coupled to the first cover 310 to be in close contact with the circuit board 201.

At this time, the first and second signal cables 211 and 213 may be taken out into the first and second cable holes 325 and 335.

As illustrated in FIG. 12, FIG. 13 and FIG. 14, the fixing frame 350 includes a heat dissipation portion 354a and plurality of fixing fingers 351, 352, and 353 branched from the heat dissipation portion 354 in different directions from each other.

The heat dissipation portion 354 is disposed on the rear surface of the circuit board 201 and is disposed on the opposite side to the light-emitting device 100, for example. The heat dissipation portion 354 may be in contact with the rear surface of the circuit board 201. The heat dissipation portion 354 dissipates the heat conducted from the circuit board 201.

A first surface of the heat dissipation portion 354 corresponding to the circuit board 201 is disposed as a flat surface and a recess portion 357 and a heat radiation rib 356 disposed on the periphery of the recess portion 357 are disposed on a region opposite to the first surface. The recess portion 357 and the heat dissipating rib 356 increase the heat radiating surface region. Here, although the recesses 357 and the heat dissipating ribs 356 may extend to the rear surfaces of the fixing fingers 351, 352, and 353, it is not limited thereto. The recess portion 357 and the heat radiation ribs 351, 352 and 353 can increase the rigidity of the fixing frame 350.

The fixing finger 351, 352, and 353 includes a first fixing finger 351, second and third fixing fingers 352 and 353. At least two of the first to third fixing fingers 351, 352 and 353 may be spaced apart from each other by an angle of 90 degrees or more with respect to the center of the fixing frame 350. The fixing fingers 351, 352 and 353 can be stably fixed to the first cover 310 with a small number.

The first fixing finger 351 may extend from the heat radiation portion 354 in a direction of a first side portion 11 of the first cover 310. An end portion 54 of the first fixing finger 351 is inserted into the finger groove 331 of the first side portion 11. The finger groove 331 may become a region where the inner rib 314 of the first side portion 11 is removed.

The second and third fixing fingers 352 and 353 may extend from the heat radiation portion 354 in diagonal directions different from each other. The second and third fixing fingers 352 and 353 extend to both side edge regions of the second side portion 12 of the first cover 310, for example. The second and third fixing fingers 352 and 353 are inserted into the finger grooves 332 and 333 of both side edge regions of the second side portion 12 of the first cover 310. The finger grooves 332 and 333 in both side edge regions may become a region where the inner ribs 314 are removed and may become an edge region between the second side portion 12 and the third and fourth side portions 13 and 14.

The end portions of the first to third fixing fingers 351, 352 and 353 are disposed in the inner finger grooves 331, 332 and 333 of the first cover 310 to prevent vertical movement and lateral movement of the fixing frame 350.

As illustrated in FIG. 13 to FIG. 16, the first fixing finger 351 includes first and second bridge portions 361 and 371 and the first and second bridge portions 361 and 371 extend in a horizontal direction, for example in a direction orthogonal to an extending direction of the first fixing finger 351.

The first bridge portion 361 includes a first guide jaw 362 and a first guide protrusion 365, and the first guide jaw 362 can be disposed in a direction orthogonal to the first bridge portion 361, for example, in a length direction of the first cable hole 325. The first guide protrusion 365 is disposed on the first guide jaw 362 and inserted into the first cable hole 325.

Here, The first guide jaw 362 is fitted in the guide groove 326 from under the first side portion 11 of the first cover 310 and is hooked inside the first side portion 11 to be coupled. At this time, although the width C2 of the first guide protrusion 365 or the width of the first cable hole 325 may become gradually narrower toward the upper surface 301 of the first cover 310, it is not limited thereto. The width C2 of the first guide protrusion 365 may be narrower than the width C4 of the guide groove 326.

The width C1 of the first guide jaw 362 is disposed to be larger than the width C2 of the first guide protrusion 365 and the width of the first cable hole 325 of the first side portion 11 and thus it is possible to prevent the resin member 340 from leaking outward.

The first guide protrusion 365 is coupled to the first cable hole 325 disposed in the first side portion 11 of the first cover 310. Here, the first cable hole 325 has a length C5 that is longer than the length C3 of the first guide protrusion 365 to provide a space into which the first signal cable 211 can be inserted. Here, the first guide jaw 362 may have a first cable groove 364 capable of supporting the first signal cable 211. The first cable groove 364 may have a curved or polygonal shape and may correspond to or be in contact with the surface of the first signal cable 211.

The second bridge portion 371 includes a second guide jaw 372 and a second guide protrusion 375. The second guide jaw 372 is inserted into a guide groove 326 of the first cover 310, and the second guide protrusion 375 is coupled to the second cable hole 335 disposed in the first side portion 11 of the first cover 310. Here, the second guide protrusion 375 and the second signal cable 213 may be inserted into the second cable hole 335. Here, the second guide jaw 372 may include a second cable groove 374 for guiding the second signal cable 213. Although the second cable groove 374 may have a curved surface or a polygonal shape, it is not limited thereto.

At least one or both of the first and second covers 310 and 390 may have cable holes 325 and 335 and the signal cables 211 and 213 connected to at least one of the light-emitting device 100 and the circuit board 201 can be taken out through the cable holes 325 and 335.

Inner sides of the first and second covers 310 and 390 may include fastening members such as bosses 21, screws, rivets, and bolts in different regions from each other.

The first cover 310 may include for example an accommodation region 320, for example, a plurality of bosses 21 protruding from the rear surface of the recess portion 302, as a fastening means. The plurality of bosses 21 may be disposed to correspond to the holes 51 of the first to third fixing fingers 351, 352, and 353. When the fixing frame 350 is in close contact with the circuit board 201, the plurality of bosses 21 are inserted into the holes 51 of the first to third fixing fingers 351, 352 and 353 and protrude therefrom. The bosses 21 may be disposed in a circular shape or a polygonal shape.

Here, the width or diameter of the plurality of bosses 21 can be decreased toward the end portion thereof, for example, as the bosses 21 are closer to the second cover 39. The plurality of bosses 21 can be fitted into the holes 51 of the fixing fingers 351, 352 and 353. Alternatively a screw thread may be disposed on the end surface of the boss 21 and when a portion of the boss 21 protrudes into the hole 51, the boss may be fastened with a fastening member such as a bolt. As another example, the end portion of the boss 21 may be caulked.

As illustrated in FIG. 16 and FIG. 17, the rear region 53 in which the holes 51 are disposed in the fixing fingers 351, 352 and 353 can provide a space in which the fastening members 50 such as the nuts can be disposed.

The first to third fixing fingers 351, 352 and 353 are fastened to the first cover 310 by fastening members 50 such as a boss 21 and a nut so that movement or separation of the circuit board 201 and the fixing frame 350 in the rear direction can be prevented. Here, the rear direction may be a direction of the second cover 390.

As another example, although the position of the fastening means can be changed, for example, the second cover 390 includes a boss, and the boss can be coupled to the first cover 310 through the hole in the fixing frame 350, it is not limited thereto.

When the light source module 200 and the fixing frame 350 are coupled to the first cover 310, the second cover 390 is coupled to the first cover 310 as illustrated in FIG. 18. At this time, the first and second signal cables 211 and 213 are taken out through the first and second cable holes 325 and 335.

When the first and second covers 310 and 390 are matched each other, the first and second covers 310 and 390 are fixed by a fixing jig (not illustrated), and a liquid resin member 340 can be injected through one of the first and second cable holes 325 and 335. Although the resin member 340 may include a material such as silicon or epoxy, it is not limited thereto.

Here, the other one of the first and second cable holes 325 and 335 provides a flow path of air to be discharged as the resin member 340 is filled. The liquid resin member 340 may be filled and cured as shown in FIG. 10. When the resin member 340 is cured, the first and second covers 310 and 390 can be fixed by the resin member 340.

The external connection terminals 207 and 208 of the circuit board 201 are not disposed not in a region adjacent to the cable holes 325 and 335 but are disposed in a region adjacent to the third side portion 13 of the first cover 11. Accordingly, since the first and second cable holes 325 and 335 exposed in the cable holes 325 and 335 and the external connection terminals 207 and 208 have predetermined distances, a distance in which moisture or water is penetrated into the external connection terminals 207 and 208 can be provided to be long.

The outside surfaces of the first and second covers 310 and 390 may be bonded to each other. The first and second covers 310 and 390 may be bonded to each other through an ultrasonic bonding process for bonding between the outside surfaces of the first and second cover 310 and 390. As another example, the outside surfaces of the first and second covers 310 and 390 may be bonded to an adhesive tape or a resin layer.

As illustrated in FIG. 10 and FIG. 18, a convex portion 397 is disposed in the center region of the second cover 390, and the convex portion 397 can protrude in the concave portion 357 of the heat radiation portion 354 of the fixing frame 350. Although the convex portion 397 may be in contact with the heat radiation portion 354 of the fixing frame 350, it is not limited thereto.

In the embodiment, since after the light source module 200 is disposed in the first and second covers 310 and 390 of the light source unit, the first cover 310 and the second cover 390 are fastened together with the fastening means not in the outside and but in the inside thereof and then are sealed, it is possible to reduce a region where moisture or water can penetrate through the outside surfaces of the first and second covers 310 and 390.

FIG. 19 is a perspective view illustrating a light source unit having a light source module according to a second embodiment, FIG. 20 is a sectional view taken along line D-D of the light source unit of FIG. 19, FIG. 21 is an exploded perspective view of a component in which the resin member is removed from the light source unit of FIG. 19. FIG. 22 is an exploded perspective view illustrating a state before the fixing frame is coupled to the first cover of FIG. 21, and FIG. 23 is a perspective view illustrating a state where the first cover and the second cover are disassembled in the light source unit of FIG. 21.

With reference to FIG. 19 to FIG. 23, the light source unit 400 includes a light source module 200 according to the embodiment, a first cover 410 which has an open region 405 through which the light of the light source module 200 is emitted and covers the light source module 200, a second cover 490 which is coupled to the first cover 410, a resin member 440 which is disposed within the first cover 410 and the second cover 490, and a fixing frame 450 which is disposed between the light source module 200 and the second cover 490.

The light source unit 400 includes cable holes 425 and 435 disposed in at least one or both of the first and second covers 410 and 490 and the signal cables 211 and 213 connected to at least one of the circuit board 201 and the light-emitting device 100 can be taken out through the cable holes 425 and 435.

The light source unit 400 seals the light source module 200 in the first and second covers 410 and 490 and takes out the signal cables 211 and 213 connected to the light source module 200 to the outside and thus supplies power to the light source module 200. The light-emitting device 100 of the light source module 200 may emit a light having a selective wavelength within a range of ultraviolet ray to visible ray according to an embodiment and may emit ultraviolet ray, for example. The ultraviolet ray may include a UVC wavelength.

The first and second covers 410 and 490 may be made of at least one of glass, plastic, polypropylene (PP), polyethylene (PE), polycarbonate (PC), polybutylene terephthalate (PBT), poly oxy methylene Polyacetal (POM), PPO (polyphenylene oxide) resin, or modified PPO resin. Here, the modified PPO resin includes a resin in which a resin such as polystyrene (PS) or polyamide (PA)-based material is mixed in PPO, and has heat resistance and low physical properties even at low temperatures. As another example, although the second cover 490 may be made of a metal material, it is not limited thereto.

Although the outer shape of the first and second covers 410 and 490 may be a polygonal shape or a circular shape in a top view shape, it is not limited thereto.

With reference to FIG. 19 and FIG. 20, the first cover 410 includes a recess portion 402 having an open region 405, and a accommodation region 420 therein.

The recess portion 402 is recessed to be lower than the upper surface of the first cover 410. The bottom surface of the recess portion 402 may include an inclined surface from the upper end of the first cover 410 to the open region 405 or may include a curved surface having a predetermined curvature. The inclined surface of the recess portion 402 may include surfaces whose edge portions have a predetermined curvature. The recess portion 402 has a gradually lower depth toward the central portion.

As another example, although the entire region of the upper surface of the first cover 410 may be disposed as a flat surface, it invention is not limited thereto. As another example, an optical lens (not illustrated) may be disposed on the open region 405 of the first cover 410 and the material of the optical lens may include glass, silicon, or epoxy material.

The open region 405 may be disposed at the bottom center portion of the recess portion 402. The light-emitting device 100 of the light source module 200 coupled between the first and second covers 410 and 490 is disposed in the open region 405. The upper portion of the light-emitting device 100 of the light source module 200 may protrude through the open region 405. The moisture-proof film 175 covering the upper and side surfaces of the light-emitting device 100 may be exposed without directly exposing the surface of the light-emitting device 100 in the open region 405. Although the width or the area of the open region 405 may be disposed to be larger than the width or the area of the upper surface of the light-emitting device 100, it is not limited thereto.

The outer shape of the open region 405 may include the same shape as the outer shape of the light-emitting device 100. Although the outer shape of the open region 405 may include a circular shape or a polygonal shape, it is not limited thereto.

The moisture-proof film 175 and the sidewalls of the open region 405 may be in contact with each other or spaced apart from each other at a predetermined interval. In a case where the moisture-barrier film 175 and the sidewall of the open region 405 are in contact with each other, the moisture-proof effect can be improved.

The moisture-proof film 175 covers an upper surface and a side surface of the light-emitting device 100 and the extending portion 71 extends to an upper surface of the circuit board 201. Here, the sidewall of the open region 405 may include a protrusion 407 and the sidewall protrusion 407 may protrude in the direction of the upper surface of the circuit board 201 along the periphery of the light-emitting device 100.

The sidewall protrusion 407 of the open region 405 may include a side sectional-section having a semicircular shape or a polygonal shape. The sidewall protrusion 407 of the open region 405 can be in contact with the extending portion 71 of the moisture-proof film 175. Since the interfaces between the extending portion 71 of the moisture-proof film 175 and the sidewall protrusion 407 of the open region 405 are in contact with each other, the penetration of moisture or water through the open region 405 can be prevented.

The sidewall protrusion 407 of the open region 405 and the extending portion 71 of the moisture-proof film 175 may be in contact with the resin member 440. The resin member 440 is filled in the region between the first cover 410 and the circuit board 201 and may be spaced apart from the moisture-proof film 175 disposed on the side surface of the light-emitting device 100. The sidewall protrusion 407 can prevent the resin member 440 from being exposed on the open region 405 and prevent moisture or water from penetrating from the outside.

As another example, the sidewall protrusion 407 may have a predetermined interval from the extending portion 71 of the moisture-proof film 175. In this case, the resin member 440 can be in contact with the moisture-proof film 175 disposed on the side surface of the light-emitting device 100 through the region between the sidewall protrusion 407 of the open region 405 and the extending portion 71 of the moisture-proof film 175. The resin member 440 can prevent moisture or water from penetrating through the open region 405 from the outside.

As illustrated in FIG. 19 and FIG. 20, the side portions 11, 12, 13, and 14 of the first cover 410 cover the side surfaces of the resin member 440. The lower ends of the side portions 11, 12, 13, and 14 are disposed on the periphery of the upper surface of the second cover 490. For example, the side portions 11, 12, 13, and 14 of the first cover 410 are disposed inside the side portions 493 of the second cover 490 and are in contact with the upper surface of the second cover 490.

The light source module 200 having the light-emitting device 100 is disposed in the accommodation region 420 of the first cover 410 and the fixing frame 450 is disposed under the light source module 200. The fixing frame 450 is disposed between the circuit board 201 of the light source module 200 and the second cover 490, dissipates the heat conducted from the circuit board 201, and maintains an interval between the second cover 490 and the circuit board 201.

The resin member 440 is filled in a region between the first and second covers 410 and 490 to seal a region between the first and second covers 410 and 490. Since the resin member 440 seals the surface of the light source module 200, moisture or water can be prevented from penetrating from the outside.

Since the resin member 440 is filled in the region between the first and second covers 410 and 490, movement of the components disposed between the first and second covers 410 and 490 can be prevented. For example, the resin member 440 is in contact with the moisture-proof film 175, the circuit board 201, the fixing frame 450 and the inner surfaces of the first and second covers 410 and 490 and thus the light source module 200, the fixing frame 450, and the first and second covers 410 and 490 are fixed. Accordingly, the resin member 440 can prevent moisture or water from penetrating from the outside of the light source unit 400.

The coupling structure of the light source module and the fixing frame will be described with reference to FIG. 22 and FIG. 23.

With reference to FIG. 22 and FIG. 23, the circuit board 201 of the light source module 200 is sandwiched between the engaging jaws 421, 422, and 423 protruding from the inside of the first cover 410 in a direction of the second cover 490. The engaging jaws 421, 422 and 423 may be disposed in three different regions from each other on the side surfaces of the circuit board 201 and may be disposed on both side edge regions of the first side surface S1 and the second side surface S2 of the circuit board 201, for example. The engaging jaw 421 may include a first engaging jaw 421 disposed on a first side surface S1 of the circuit board 201 and a second and a third engaging jaws 422 and 423 disposed on both edge regions of a second side surface S2 opposite side to the first side surface S1 of the circuit board 201. The first side surface S1 of the circuit board 201 may be disposed adjacent to the first side portion 11 of the first cover 410 and the second side surface S2 may be disposed adjacent to the second side portion 12 of the first cover 410.

Thus, the movement of the circuit board 201 in each lateral direction can be prevented.

The light-emitting device 100 of the light source module 200 is inserted into the open region 405 of the recess portion 402. Here, as illustrated in FIG. 20, since the sidewall protrusion 407 of the open region 405 is in contact with the extending portion 71 of the moisture-proof film 175 disposed on the circuit board 201, the resin member 440 can be prevented from penetrating into the open region 405.

When the circuit board 201 is disposed in the accommodation region 420 of the first cover 410, the fixing frame 450 is in close contact with the circuit board 201 and is coupled to the first cover 410. At this time, the first and second signal cables 211 and 213 may be taken out into the first and second cable holes 425 and 435, respectively.

The fixing frame 450 includes a heat dissipation portion 454 and plurality of fixing fingers 451, 452 and 453 branched from the heat dissipation portion 454 in different directions from each other.

The heat dissipation portion 454 is disposed on the rear surface of the circuit board 201, is disposed on the second surface opposite to the first surface on which the light-emitting device 100 is disposed, for example, and dissipates the heat conducted from the circuit board 201. The surface of the heat radiation portion 454 corresponding to the circuit board 201 may be disposed as a flat surface and may be in close contact with the rear surface of the circuit board 201. The fixing frame 450 may include at least one of a metal material and a non-metallic material such as resin or ceramic.

The fixing fingers 452, 453, and 454 include a first fixing finger 451 and a second and a third fixing fingers 452 and 453. At least two of the first to third fixing fingers 451, 452 and 453 may be spaced apart from at an angle of 90 degrees or more from each other about the fixing frame 450.

The first fixing finger 451 may extend from the heat radiation portion 454 in a direction of the first side portion 11 of the first cover 410. The first fixing finger 451 may be disposed on the rear surface of the first engaging jaw 421 of the first cover 410.

The second and third fixing fingers 452 and 453 may extend in different diagonal directions from the heat radiation portion 454. The second and third fixing fingers 452 and 453 may be disposed on the rear surfaces of the second and third engaging jaws 422 and 423 of the first cover 410.

As illustrated in FIG. 22 and FIG. 23, the first fixing finger 451 includes first and second bridge portions 461 and 471, and the first and second bridge portions 461 and 471 extend in a horizontal direction, for example, in a direction orthogonal to the extending direction of the first fixing finger 451. Here, the first and second bridge portions 461 and 471 are coupled to each other by engaging with the inside of the first side portion 11 of the first cover 410.

The first bridge portion 461 includes a first guide protrusion 465 and the first guide protrusion 465 can be disposed in a direction orthogonal to the first bridge portion 461, for example in a direction of length of the first cable hole 425. The first guide protrusion 465 is disposed on the first bridge portion 462 and inserted into the first cable hole 425.

The first bridge portion 461 includes a first cable groove 464 and the first cable groove 464 guides a first signal cable 211 that is taken out into the first cable hole 425. The first cable groove 464 may have a curved shape or a polygonal shape and may correspond to or be in contact with the surface of the first signal cable 211.

The second bridge portion 471 includes a second guide protrusion 475 and the second guide protrusion 475 is coupled with the second cable hole 435 disposed on the first side portion 11 of the first cover 410. Here, the second guide protrusion 475 and the second signal cable 213 may be inserted into the second cable hole 435. Here, the second bridge portion 471 may include a second cable groove 474 for guiding the second signal cable 213. Although the second cable groove 474 may have a curved surface or a polygonal shape, it is not limited thereto.

Cable holes 425 and 435 are disposed in at least one or both of the first and second covers 410 and 490 and the signal cables 211 and 213 connected to the light source module 200 can be taken out through the cable holes 425 and 435.

As another example, although the first and second bridge portions 461 and 471 may have the engaging jaw and the protrusion structure as in the first embodiment, it is not limited thereto.

The fastening holes 93 are disposed in the first to third engaging jaws 421, 422, and 423 of the first cover 410. The first and second fixing fingers 451, 452 and 453 include holes 51 at positions corresponding to the fastening holes 93.

As illustrated in FIG. 23, when the fixing frame 450 is in close contact with the circuit board 201, the fastening holes 93 of the first cover 410 and the holes 51 of the first to third fastening fingers 451, 452 and 453 can be fastened by the fastening member 91. Accordingly, the fixing frame 450 can bring the circuit board 201 into close contact with the first cover 410, and the movement of the circuit board can be prevented. As the fastening means for fastening the fastening frame 450 to the first cover 410 according to the embodiment, a fastening hole 93 and a fastening member 91 such as a screw may be provided.

As another example, although a fastening member such as a screw may be disposed on the first to third fastening shoulders 421, 422, and 423 and fastened with a fastening member such as a bolt can be fastened from the rear surface of the fixing frame 450 after the circuit board 201 is fixed, it is not limited thereto.

The light source module 200 and the fixing frame 450 are coupled to the first cover 410 and the second cover 490 is coupled to the first cover 410. At this time, the first and second signal cables 211 and 213 are taken out to the first and second cable holes 425 and 435, respectively.

When the first and second covers 410 and 490 are matched each other, the first and second covers 410 and 490 are fixed by the fixing jig and the liquid resin member is injected through one of the first and second cable holes 425 and 435. At this time, the other one of the first and second cable holes 425 and 435 provides a flow path of air to be discharged as the resin member 440 is filled therein. The liquid resin member may be filled and cured as illustrated in FIG. 20. Although the resin member 440 may include a material such as silicon or epoxy, it is not limited thereto.

When this resin member is cured, the cured resin member 440 can support and fix the first and second covers 410 and 490, the light source module 200, and the fixing frame 450.

The outer rims of the first and second covers 410 and 490 may be bonded to each other through an ultrasonic bonding process for bonding to each other.

Since the embodiment is disposed such that the fastening means for fastening the internal components of the light source unit is not disposed on the outside but disposed in the inside of the first cover 410 and the second cover 490, it can reduce the region where moisture or water can penetrate through the first and second covers 410 and 490.

FIG. 24 is a perspective view illustrating a light source unit having a light source module according to a third embodiment, FIG. 25 is a cross-sectional view taken along line E-E of the light source unit of FIG. 23, FIG. 26 is an exploded perspective view illustrating components in which the resin member is removed from the light source unit of FIG. 24, and FIG. 27 is a perspective view of a state where the first cover and the second cover are disassembled from the light source unit of FIG. 26.

With reference to FIG. 24 to FIG. 27, the light source unit 500 includes a light source module 200 according to the embodiment, first and second covers 510 and 590 which covers the light source module 200, and a resin member 540 which is disposed between the first and second covers 510 and 590. The third embodiment has a structure from which a fixing frame is removed, unlike the first and second embodiments. The rear surface of the circuit board 201 of the light source module 200 may be in contact with the upper surface of the second cover 590.

The light source unit 500 has cable holes H1 and H2 disposed in at least one or both of the first and second covers 510 and 590 and the signal cables 211 and 213 connected to at least one of the circuit board 201 and the light-emitting device 100 can be taken out through the cable holes H1 and H2.

The light source unit 500 seals the light source module 200 in the first and second covers 510 and 590 and taken out the signal cables 211 and 213 connected to the light source module 200 to the outside and supplies power to the light source module 200. The light-emitting device 100 of the light source module 200 may emit a light having a selective wavelength within a range of ultraviolet ray to visible ray according to the embodiment and may emit ultraviolet ray, for example. The ultraviolet ray may include a UV-C wavelength.

The first and second covers 510 and 590 may be made of at least one of glass, plastic, polypropylene (PP), polyethylene (PE), polycarbonate (PC), polybutylene terephthalate (PBT), poly oxy methylene, polyacetal (POM), polyphenylene oxide (PPO) resin, or modified PPO resin. Here, the modified PPO resin includes a resin in which PPO is mixed with a resin such as polystyrene (PS) or polyamide (PA) based resin, and has heat resistance and low physical properties even at low temperatures. As another example, although the second cover may be made of a metal material, it is not limited thereto.

Although the outer shape of the first and second covers 510 and 590 may be a polygonal shape or a circular shape in a top view shape, it is not limited thereto.

With reference to FIG. 24 and FIG. 25, the first cover 510 includes a recess portion 502 having an open region 505. An accommodation region 520 in which the light source module 200 is disposed includes between the first and second covers 510 and 590.

The recess portion 502 may be recessed to be lower than the upper end of the first cover 510 and the open region 505 may be disposed at the bottom center portion of the recess portion 502. The light-emitting device 100 of the light source module 200 coupled between the first and second covers 510 and 590 is disposed in the open region 505.

The upper portion of the light-emitting device 100 of the light source module 200 may protrude through the open region 505. The moisture-proof film 175 covering the upper surface and the side surfaces of the light-emitting device 100 may be exposed in the open region 505 without directly exposing the surface of the light-emitting device 100. Although the width or the area of the open region 505 may be disposed to be larger than the width or the upper surface area of the light-emitting device 100, it is not limited thereto.

The outer shape of the open region 505 may include the same shape as the outer shape of the light-emitting device 100. Although the outer shape of the open region 505 may include a circular shape or a polygonal shape, it is not limited thereto.

The sidewalls of the moisture-barrier film 175 and the open region 505 may be in contact with each other or spaced apart from each other at a predetermined interval. In a case where the sidewalls of the moisture-proof film 175 and the open region 505 are in contact with each other, the moisture-proof effect can be improved.

The moisture-proof film 175 covers an upper surface and side surfaces of the light-emitting device 100, and the extending portion 71 extends to an upper surface of the circuit board 201. Here, the sidewalls of the open region 505 may include protrusions 507 and the sidewall protrusion 507 may protrude in the direction of the upper surface of the circuit board 201 along the periphery of the light-emitting device 100.

The side cross-section of the sidewall protrusion 507 of the open region 505 may have a semicircular shape or a polygonal shape. The sidewall protrusion 507 of the open region 505 may be in contact with the extending portion 71 of the moisture-proof film 175. Since the interfaces between the extending portion 71 of the moisture-proof film 175 and the sidewall protrusion 507 of the open region 505 are in contact with each other, the penetration of moisture or water through the open region 505 can be prevented.

The sidewall protrusion 507 of the open region 505 and the extending portion 71 of the moisture-proof film 175 may be in contact with the resin member 540. The resin member 540 is filled in the region between the first cover 510 and the circuit board 201 and may be spaced apart from the moisture-proof film 175 disposed on the side surface of the light-emitting device 100. The sidewall protrusion 507 prevents the resin member 540 from being exposed on the open region 505 and prevents moisture or water from penetrating from the outside.

As another example, the sidewall protrusion 507 may have a predetermined interval with the extending portion 71 of the moisture-proof film 175. In this case, the resin member 540 is in contact with the moisture-proof film 175 which is disposed on the side surface of the light-emitting device 100 through a region between the sidewall protrusions 507 of the open region 505 and the extending portion 71 of the moisture-proof film 175. The resin member 540 can prevent moisture and water from penetrating from the outside in the open region 505.

As illustrated in FIG. 25, the resin member 540 is filled in the accommodation region 520 between the first and second covers 510 and 590 to seal the region between the first and second covers 510 and 590. Since the resin member 540 seals the surface of the light source module 200, the penetration of moisture or water from the outside can be prevented.

Since the resin member 540 is filled in the region between the first and second covers 510 and 590, the movement of the components disposed between the first and second covers 510 and 590 can be prevented. For example, the resin member 540 is in contact with the moisture-proof film 175, the circuit board 201, and the inner surfaces of the first and second covers 510 and 590 and thus the light source module 200 and the first and second covers 510 and 590 are fixed.

As illustrated in FIG. 26 and FIG. 27, the light source module 200 having the light-emitting device 100 is disposed in the accommodation region 520 between the first cover 510 and the second cover 590.

The circuit board 201 of the light source module 200 may be coupled to the accommodation region 520 between the first and second covers 510 and 590. The second cover 590 is in contact with the rear surface of the circuit board 201 of the light source module 200 and dissipates the heat conducted from the circuit board 201.

The circuit board 201 of the light source module 200 is fitted between the engaging jaws 521, 522 and 523 protruding from the inside of the first cover 510 in a direction of the second cover 590 and the engaging jaws 581, 582, and 583 protruding from the inside of the second cover 590 in a direction of the first cover 510.

The engaging jaws 521, 522, and 523 of the first cover 510 may be disposed in at least two regions, for example, three regions different from each other along the outside of the circuit board 201 to support the outside surface of the circuit board 201. The engaging jaws 521, 522 and 523 can be disposed at both side edge regions of the first side surface S1 and the second side surface S2 opposite to the first side surface S1 of the circuit board 201, for example. The engaging jaws 521, 522, and 523 may include a first engaging jaw 521 disposed on a first side surface S1 adjacent to the first side portion 11 of the first cover 510 among the side surfaces of the circuit board 201, and second and third engaging jaws 522 and 523 disposed at both side edge regions of the second side surface S2 opposite to the first side surface S1 of the circuit board 201. The first side surface S1 of the circuit board 201 may be disposed adjacent to the first side portion 11 of the first cover 510 and the second side surface S2 may be disposed adjacent to the second side portion 12 of the first cover 510.

The engaging jaws 581, 582, and 583 of the second cover 590 may protrude from the inside of the second cover 590 in a direction of the first cover 510. The engaging jaws 581, 582 and 583 of the second cover 590 may be disposed in at least two regions, for example, different regions from each other along the outside of the circuit board 201 to support the outside surface of the circuit board 201. The engaging jaws 581, 582, and 583 of the second cover 590 may be disposed at both side edge regions of the first side surface S1 of the circuit board 201 and the second side surface S2 opposite to the first side surface S1, for example.

The engaging jaws 581, 582, and 583 of the second cover 590 may be disposed to face the first to third engaging jaws 521, 522, and 523 of the first cover 510.

The engaging jaws 581, 582, and 583 of the second cover 590 and the engaging jaws 521 522 523 of the first cover 510 support the periphery of the circuit board 201 and the movement of the circuit board 201 can be prevented.

The first and second covers 510 and 590 may include a coupling structure of the boss 95 and the hole 92 as a fastening means for coupling with each other. For example, a plurality of bosses 95 may be disposed on the first cover 510 and a plurality of holes 92 may be disposed on the second cover 590 at positions corresponding to the bosses 95. Each of the bosses 95 may be inserted into the hole 92 when the first and second covers 510 and 590 are coupled to each other.

The bosses 95 may be disposed on at least two, for example, each of the first to third engaging jaws 521, 522, and 523 of the first cover 510. The holes 92 may be disposed in the respective engaging jaws 581, 582, and 583 of the second cover 590.

As another example, although a hole may be disposed in the first cover 510 and a boss may be disposed in the second cover 590, it is not limited thereto.

At least one of the first cover 510 and the second cover 590 may include engaging protrusion, and for example, a plurality of engaging protrusions 571, 572, and 573 protruding in a direction of the second cover 590 may include in the inside of the second cover 590. The connecting shapes of the line segments connecting the plurality of engaging jaws 571, 572 and 573 may have different shapes 72 from the shapes of the line segments connecting the engaging jaws 581, 582, and 583 of the second cover 590. The shapes of the line segments connecting the engaging jaws 581, 582, and 583 of the second cover 590 may have triangular shapes, and the shapes of the line segments connecting the plurality of engaging jaws 571, 572, and 573 may have inverted triangular shapes.

The length of a line segment connecting the plurality of engaging jaws 571, 572, 573 may be shorter than the length of a line segment connecting the plurality of engaging jaws 581, 582, and 583. The plurality of engaging jaws 571, 572, and 573 may be disposed between engaging jaws 581, 582, and 583 adjacent to each other, respectively.

In at least one of the engaging jaws 571, 572, and 573, a surface which is in contact with the circuit board 201 may be curved or angled, for example, at least two of the engaging jaws 571 and 572 may include curved surfaces R1 and R2.

The plurality of engaging jaws 571, 572, and 573 can be coupled to the engaging grooves 271, 272, and 273 of the circuit board 201. Although the engaging grooves 271, 272, and 273 may be disposed on both side surfaces adjacent to the first side surface 51 of the circuit board 201 and on the second side surface S2, respectively, it is not limited thereto. At least one or two of the engaging grooves 271, 272, and 273 may include curved surfaces corresponding to the curved surfaces R1, and R2 of the engaging protrusions 571, 572, and 573.

Although the width of the first side surface 51 of the circuit board 201 may be narrower than the width of the second side surface S2, it is not limited thereto. Although the width of the first side surface S1 of the circuit board 201 may be the same as the interval of the engaging protrusions 571 and 572 of the second cover 590, it is not limited thereto.

In the circuit board 201, the engaging grooves 271, 272 and 273 are coupled with the engaging protrusions 571, 572 and 573 of the second cover 590 and the outside of the circuit board 201 can be inserted into a region between the engaging jaws 521, 522 and 523 of the first cover 510 and the engaging jaws 581, 582, and 583 of the second cover. The light source module 200 having the circuit board 201 can be in close contact with a region between the first and second covers 510 and 590 by coupling between the bosses 95 and the holes 92 with each other.

One of the first cover 510 and the second cover 590 has a concave structure and the other thereof has a convex structure and can be matched each other for matching the side portions of the first cover 510 and the second cover 590. For example, the side portions 11. 12, 13, and 14 of the first cover 510 include a concave portion 515 and the concave portion 515 is disposed on a region between the outside surface of the side portions 11, 12, 13, and 14 and an inner rib 515A. The concave portion 515 is disposed at a predetermined depth along the outside surface of the first cover 510.

The side portion 593 of the second cover 590 includes a convex portion 595 and the convex portion 595 is inserted into the concave portion 515 of the first cover 510. The convex portion 595 is disposed inside the side portion 593 of the second cover 590. Accordingly, the outside surfaces of the side portions 11, 12, 13, and 14 of the first cover 510 can be disposed on the same vertical surface as the outside surface of the side portion 593 of the second cover 590.

As another example, although the second cover 590 may have a concave portion (not illustrated) and a convex portion 595 in the first cover 510 to be coupled to the concave portion, it is not limited thereto.

The first cover 510 and the second cover 590 include a plurality of cable holes H1 and H2 and a plurality of external connection holes H3 and H4 connected to the resin member 540.

The cable holes H1 and H2 may be formed by the cable grooves 61 and 63 of the first side portion 11 of the first cover 510 and the cable grooves 62 and 64 of the second cover 590 corresponding to the cable grooves 61 and 63. The external connection holes H3 and H4 may be formed by the connection grooves 65 and 67 disposed in the first side portion 11 of the first cover 510 and the connection grooves 66 and 68 in the second cover 590. An interval between the cable grooves 62 and 64 in the first side portion 11 is larger than an interval between the connection grooves 65 and 67 so that the resin member 540 can be injected through the connection grooves 65 and 66 or the outflow of air cannot be interfered.

At this time, the first and second signal cables 211 and 213 are taken out through the first and second cable holes 111 and H2.

When the first and second covers 510 and 590 are matched each other, these units are fixed by a fixing jig, and a liquid resin member 540 is inserted through any one of the first and second external connection holes H3 and H4. Although the resin member 540 may include a material such as silicon or epoxy, it is not limited thereto.

At this time, the other one of the first and second external connection holes H3 and H4 provides a flow path of the discharged air as the resin member 540 is filled. Thereafter, the liquid resin member 540 may be cured. When the resin member 540 is cured, the first and second covers 510 and 590 and the light source module 200 can be fixed by the resin member 540. Although the resin member 540 may be exposed or connected to the first and second external connection holes H3 and H4, it is not limited thereto.

The outer edges of the first and second covers 510 and 590 may be bonded to each other through an ultrasonic bonding process.

In the embodiment, since the fastening means for fastening the components of the light source unit is not disposed on the outside but is disposed in the inside of the first cover 510 and the second cover 590, the region where water can penetrate can be decreased. Since the third embodiment seals and supports the light source module 200 without using a fixing frame as in the first and second embodiments, the thickness of the light source unit 500 can be decreased.

The light-emitting device according to the embodiment and the light source unit having the same can be used as a sterilizing device for the indoor unit, the evaporator and the condensed water of the refrigerator, and the sterilizing device in an appliance such as the air washer, and a sterilizing device for a water tank of a water storage portion and discharging water of a water purifier, and a sterilizing device in a closet. Such a sterilization device may selectively include the moisture-proof film 175 described above.

The features, structures, effects or the like in the embodiments described above are included in at least one embodiment of the present invention and are not necessarily limited to only one embodiment. Further, the features, structures, effects, or the like illustrated in the respective embodiments can be combined or modified and applied to another embodiment by those of ordinary skill in the art to which the invention pertains. Accordingly, contents related to such combinations and modifications are to be construed to fall within the scope of the invention.

INDUSTRIAL APPLICABILITY

The light source unit of the embodiment can increase the reliability with respect to the moisture proof.

The light source unit of the embodiment can be applied to the sterilizing device.

The invention claimed is:

1. A light source unit, comprising:
a first cover which has an open region;
a second cover which is coupled to the first cover;
a light source module which is disposed between the first cover and the second cover and has a light-emitting device disposed on the open region and a circuit board on which the light-emitting device is disposed;
a fixing frame which is disposed between the second cover and the circuit board; and
a resin member which is filled in a region between the first cover and the second cover and supports the light source module and the fixing frame,
wherein the light source module includes a moisture-proof film which covers an upper surface and side surfaces of the light-emitting device and extends to an upper surface of the circuit board,
wherein the first cover includes a recess portion having the open region and concavely recessed from an outer upper surface of the first cover,
wherein an upper portion of the light-emitting device is protruded through the open region of the first cover,
wherein the light-emitting device emits a wavelength band of 100 nm to 280 nm,
wherein the light-emitting device includes a body, a light-emitting chip on the body, and a transparent window on the light-emitting chip, and
wherein the moisture-proof film is disposed on the transparent window.

2. The light source unit according to claim 1, wherein a plurality of cable holes through which a signal cable connected to the circuit board is taken out is provided in at least one of the first and second covers, and
wherein holes of the plurality of cable holes are spaced apart from each other.

3. The light source unit according to claim 2, wherein the fixing frame includes:
a heat dissipation portion which is disposed on a rear surface of the circuit board; and
a plurality of fixing fingers which are branched from the heat dissipating portion in different directions from each other and coupled to the first cover,
wherein the plurality of fixing fingers includes a hole coupled with the first cover by a fastening member.

4. The light source unit according to claim 3, wherein the plurality of cable holes is disposed in a first side portion of the first cover, and
wherein one of the plurality of fixing fingers includes a guide protrusion which is coupled to one of the plurality of cable holes and at least one bridge portion which includes a guide jaw for supporting the guide protrusion in the first side portion.

5. The light source unit according to claim 3, wherein a plurality of engaging jaws for supporting an outside of the circuit board is provided in an inside of the first cover, and
wherein the plurality of engaging jaws includes a hole or a boss coupling with the plurality of fixing fingers.

6. The light source unit according to claim 1, wherein a bottom surface of the recess portion is gradually deeper from the outer upper surface to the open region of the first cover,
wherein the moisture-proof film disposed on the light-emitting device protrudes into the open region of the first cover, and
wherein a number of light-emitting devices is equal to a number of open regions.

7. The light source unit according to claim 1,
wherein the body of the light-emitting device has a recess in which the light-emitting chip is disposed, and
wherein the transparent window is disposed on the recess and is spaced apart from the light-emitting chip.

8. The light source unit according to claim 1, wherein the moisture-proof film comprises a fluororesin-based material.

9. The light source unit according to claim 1, wherein a sidewall protrusion that is in contact with the moisture-proofing film disposed on the circuit board is provided in the periphery of the open region of the first cover, and
wherein the sidewall protrusion is disposed between the light-emitting device and the resin member.

10. The light source unit according to claim 1, wherein side portions of the first and the second covers are bonded to each other, and
wherein a fastening member is not provided in outsides of the first and second covers.

11. The light source unit according to claim 1, wherein a side portion of the first cover includes a plurality of rib protrusions protruded toward a direction of the second cover, and
wherein a side portion of the second cover includes a plurality of protruding grooves coupled to the plurality of rib protrusions.

12. The light source unit according to claim 1, wherein an outer shape of the light-emitting device and the open region are the same, and
wherein the moisture-proof film is spaced apart from a side wall of the open region.

13. The light source unit according to claim 1, wherein the moisture-proof film includes a first region disposed on a surface of the light-emitting device, a second region between the resin member and the circuit board, and a third region in contact with a region between the first cover and the circuit board.

14. The light source unit according to claim 3, wherein the heat dissipation portion includes a first surface corresponding to the circuit board, a concave portion at an opposite region to the first surface, and a heat dissipation rib around the concave portion, and
wherein the second cover includes a convex portion protruded in a direction of the concave portion of the heat dissipation portion from a center region of the second cover.

15. A light source unit, comprising:
a first cover which has an open region;
a second cover which is coupled to the first cover;
a light source module which is disposed between the first cover and the second cover and has a light-emitting device disposed on the open region and a circuit substrate disposed between the light-emitting device and the second cover;
a plurality of engaging jaws which support an outside of the circuit board to an inside of at least one of the first cover and the second cover; and
a resin member which is filled in a region between the first cover and the second cover and supports the light source module,
wherein the light source module includes a moisture-proof film which covers an upper surface and side surfaces of the light-emitting device and extends to an upper surface of the circuit board,
wherein the circuit board is in contact with an upper surface of the second cover,
wherein the first cover includes a recess portion having the open region and concavely recessed from an outer upper surface of the first cover,
wherein an upper portion of the light-emitting device is protruded through the open region of the first cover,
wherein a bottom surface of the recess portion is gradually deeper from the outer upper surface to the open region of the first cover,
wherein the moisture-proof film disposed on the light-emitting device protrudes into the open region, and
wherein the light-emitting device emits a wavelength band of 100 nm to 280 nm.

16. The light source unit according to claim 15, wherein the first cover and the second cover include a plurality of bosses and holes in regions corresponding to each other.

17. The light source unit according to claim 16, wherein a plurality of engaging protrusions which support an outside of the circuit board is provided in an inside of the first cover, and
wherein the plurality of engaging protrusions and the plurality of engaging jaws are disposed at positions of the circuit board different from each other.

18. The light source unit according to claim 15, wherein any one of side portions of the first and the second covers includes a concave portion and the other one thereof includes a convex portion.

19. The light source unit according to claim 15, wherein cable holes spaced apart from each other and a plurality of external connection holes connected to the resin member are provided in the first and second covers.

20. The light source unit according to claim 15, wherein the resin member is in contact with the moisture-proof film, the circuit board, the fixing frame, and inner surfaces of the first and second covers.

* * * * *